(12) United States Patent
Fox et al.

(10) Patent No.: US 8,933,537 B2
(45) Date of Patent: Jan. 13, 2015

(54) BIPOLAR TRANSISTOR HAVING SELF-ADJUSTED EMITTER CONTACT

(75) Inventors: Alexander Fox, Frankfurt (DE); Bernd Heinemann, Frankfurt (DE); Steffen Marschmeyer, Frankfurt (DE)

(73) Assignee: IHP GmbH—Innovations for High Performance Microelectronics/Leibniz-Institut fur Innovative Mikroelekronik, Frankfurt (Oder) (DE)

( * ) Notice: Subject to any disclaimer, the term of this patent is extended or adjusted under 35 U.S.C. 154(b) by 559 days.

(21) Appl. No.: 12/998,869

(22) PCT Filed: Dec. 3, 2009

(86) PCT No.: PCT/EP2009/066316
§ 371 (c)(1),
(2), (4) Date: Aug. 26, 2011

(87) PCT Pub. No.: WO2010/066630
PCT Pub. Date: Jun. 17, 2010

(65) Prior Publication Data
US 2012/0001192 A1  Jan. 5, 2012

(30) Foreign Application Priority Data

Dec. 12, 2008 (DE) .......................... 10 2008 054 576
Mar. 13, 2009 (DE) .......................... 10 2009 001 552

(51) Int. Cl.
*H01L 27/102* (2006.01)
*H01L 29/66* (2006.01)
*H01L 29/08* (2006.01)
*H01L 29/10* (2006.01)
*H01L 29/161* (2006.01)
*H01L 29/732* (2006.01)
*H01L 29/737* (2006.01)

(52) U.S. Cl.
CPC ...... *H01L 29/66272* (2013.01); *H01L 29/0804* (2013.01); *H01L 29/1004* (2013.01); *H01L 29/161* (2013.01); *H01L 29/66242* (2013.01); *H01L 29/7322* (2013.01); *H01L 29/7371* (2013.01)
USPC ............................ 257/587; 257/571; 257/586

(58) Field of Classification Search
CPC .............. H01L 29/732; H01L 29/0804; H01L 29/1004
USPC .................................. 257/565, 571, 586, 587
See application file for complete search history.

(56) References Cited

U.S. PATENT DOCUMENTS 5,286,661 A   2/1994  de Fresart et al. .............. 437/31
8,405,127 B2 *  3/2013  Chu et al. ...................... 257/197

(Continued)

FOREIGN PATENT DOCUMENTS

DE   10327709   1/2005
DE   10358047   6/2005

(Continued)

OTHER PUBLICATIONS

English abstract for DE 10327709.

(Continued)

*Primary Examiner* — Matthew E Warren
(74) *Attorney, Agent, or Firm* — Ware, Fressola, Maguire & Barber LLP

(57) ABSTRACT

A semiconductor device, comprising a substrate layer made of a semiconductor material of a first conductivity type and having a first insulation region, and a vertical bipolar transistor having a first vertical portion of a collector made of monocrystalline semiconductor material of a second conductivity type and disposed in an opening of the first insulation region, a second insulation region lying partly on the first vertical portion of the collector and partly on the first insulation region and having an opening in the region of the collector, in which opening a second vertical portion of the collector made of monocrystalline material is disposed, said portion including an inner region of the second conductivity type, a base made of monocrystalline semiconductor material of the first conductivity type, a base connection region surrounding the base in the lateral direction, a T-shaped emitter made of semiconductor material of the second conductivity type and overlapping the base connection region, wherein the base connection region, aside from a seeding layer adjacent the substrate or a metallization layer adjacent a base contact, consists of a semiconductor material which differs in its chemical composition from the semiconductor material of the collector, the base and the emitter and in which the majority charge carriers of the first conductivity type have greater mobility compared thereto.

9 Claims, 21 Drawing Sheets

(56) References Cited

U.S. PATENT DOCUMENTS

| | | | |
|---|---|---|---|
| 2001/0017399 A1* | 8/2001 | Oda et al. | 257/565 |
| 2005/0006724 A1 | 1/2005 | Ehwald et al. | 257/588 |
| 2009/0065804 A1 | 3/2009 | Pagette et al. | 257/190 |
| 2009/0179303 A1 | 7/2009 | Heinemann et al. | 257/586 |
| 2009/0206370 A1 | 8/2009 | Chu et al. | 257/197 |

FOREIGN PATENT DOCUMENTS

| | | |
|---|---|---|
| DE | 102004061327 | 6/2006 |
| EP | 0418421 | 9/1989 |
| WO | WO 03/046948 | 6/2003 |

OTHER PUBLICATIONS

English abstract for DE 10358047.

English abstract for EP 0418421.

IEEE, 0-7803-7873-3/03; Washio, K.; "SiGe HBT and BiCMOS Technologies"; whole document; 2003.

European Patent Office; Dauw, X.; "International Search Report"; whole document (in German only); May 11, 2010.

* cited by examiner

BIPOLAR TRANSISTOR HAVING SELF-ADJUSTED EMITTER CONTACT

CROSS REFERENCE TO RELATED APPLICATIONS

This application is the U.S. National Stage of International Application No. PCT/EP2009/066316 filed on Dec. 3, 2009 which was published in German on Jun. 17, 2010 under International Publication Number WO 2010/066630.

BACKGROUND OF THE INVENTION

1. Technical Field

The invention relates to a bipolar semiconductor device comprising one or more vertical bipolar transistors which have an emitter region, a base region and a collector region, wherein the emitter in standard T-shaped design laterally overlaps the base connection region laterally adjoining the base. The invention also relates to a method for producing such a bipolar semiconductor device.

2. Discussion of Related Art

The performance of silicon-based bipolar transistors (or bipolar junction transistors (BJT)) has been significantly improved in the field of high-speed semiconductors by novel component designs and material components, and by reductions in the size of structures.

Key features of modern vertical high-speed bipolar transistors are described in K. Washio, "SiGe HBT and BiCMOS Technologies", IEDM, pp. 113-116, 2003. More advanced embodiments can be found in DE 10 2004 061327 and in US 2005/006724.

Known designs contain highly conductive base and collector connection regions which conduct the charge-carrying current from the inner region of the transistor to the respective contact regions. High conductivity is achieved with locally well-controlled doping and, in at least one design, with a monocrystalline base connection region. In order to simultaneously ensure a low capacitance between the base connection region and the other electrical connections of the transistor, the semiconductor regions are separated from each other by insulator regions with low dielectric constants, e.g., by silicon dioxide. The resultant overlaps of the emitter and collector regions with the base are kept as small as possible, which is specifically achieved with self-aligning methods.

"Double polysilicon technology" and "single polysilicon technology" with differential base epitaxy have been established as production methods for silicon-based bipolar (junction) transistors (BJT). The latter method has been developed with technologies for reducing the base resistance and the base-collector capacitance, as described in DE 10 2004 061 327, and with technologies for maximizing the use of self-aligning production methods, as described in US 2005/006724. These methods shall now be discussed in more detail.

a) Double Polysilicon Technology

The interrelationships are illustrated first of all for double-polysilicon technology with reference to FIG. 1, which shows a prior art bipolar transistor in cross-section, the main features of which are the same as the transistor in FIG. 1(a) in the aforementioned publication by Washio. A collector region 20 is bounded at the bottom by a substrate 10 and laterally by wells 11 in the silicon that are filled with silicon dioxide ($SiO_2$) and which are also called "field isolation regions".

Various prior art embodiments use either shallow field isolation regions in the form of shallow trenches (shallow trench isolation, STI), as shown in FIG. 1, or, alternatively, deep trenches.

In the vertical direction, the collector region 20 is composed of a highly doped collector region 21 on the substrate side and a lightly doped collector region 23 above the highly doped region. In the lateral direction, the collector region is adjoined under the STI regions 11 by portions 22 of a collector connection region.

A collector window 34 is formed above the collector region 20, in a layer stack comprising a first insulator layer 30, a polysilicon layer 31 and a second insulator layer 32. By selectively etching the first insulator layer 30, a portion of the polysilicon layer 31 projecting laterally beyond the first insulator region 30 is produced at the lateral edge of the window 34. The end faces of the overhanging portion of polysilicon layer 31 are provided with spacers 50 made of insulator material.

During a selective epitaxy step for producing a base layer 40, silicon fronts grow simultaneously from the exposed portions of the polysilicon layer 31 and the collector region 20 toward each other in a vertical direction and close the gap between the polysilicon layer 31 serving as part of the base connection region and the inner transistor region.

A T-shaped emitter region 60 adjoins the base layer 40 at the bottom with a vertical portion corresponding to the vertical bar of its T-shape, and laterally adjoins the spacers 50. Deposited over the SiGe layer is a cap layer which can receive dopants diffusing out of the emitter during the production process and which can receive at least part of the base-emitter space charge zone. The boundary of the cap layer on the emitter side is indicated by a broken separating line in the emitter. Portions of the emitter 60, corresponding to the horizontal bar of the T-shape, rest sideways on the second insulator layer 32.

Another typical feature of this known transistor design is a selectively implanted collector (SIC) region in which the level of collector doping is raised locally in order to simultaneously minimize the collector-base transit time, the base-collector capacitance and the collector resistance in a way that permits good high-speed properties on the part of the transistor.

In this design, various dimensions are self-aligning: firstly, the overlap between the polysilicon layer 31 and the selectively grown base 40, which simultaneously has an importance share of the base-collector capacitance. The lateral distance between the highly doped polysilicon layer 31 and the emitter window 62 is likewise self-aligned by spacers 50. The position of the SIC region 33 is likewise self-aligning in relation to the collector window 34 and to the emitter window 62, in that the opening provided by means of spacers 50 in the polysilicon layer 31 serves as masking.

b) Single Polysilicon Technology

FIG. 2 shows a cross-sectional view of another vertical bipolar transistor according to the prior art. A portion of the inner transistor region is shown schematically, as are the adjoining base connection and collector connection regions. The transistor in FIG. 2 has a single-polysilicon structure with a differentially deposited base. Essential features of the collector design are identical to those of the double-polysilicon variant shown in FIG. 1.

A collector 120 is enclosed from below by a substrate 110 and toward the sides by STI regions 111. The collector 120 has a highly doped portion 121 at the substrate side. Toward the surface, the collector has a lightly doped portion 123.

Unlike the double-polysilicon structure shown in FIG. 1, in which the polysilicon layer 31 is deposited independently of the base layer, the single-polysilicon variant involves depositing polycrystalline semiconductor material 130 during the differential epitaxy step for producing the base on the field isolation regions, wherein said polycrystalline semiconductor material 130 can be used as part of the base connection region.

For the reasons mentioned further above, an SIC region 133 is used in the same manner as in the double-polysilicon variant. Known single-polysilicon transistor structures also typically have more weakly doped silicon regions in lateral proximity to the SIC region 133, which cause undesired capacitances between the base connection and collector regions.

As in the double-polysilicon variant, the emitter is executed as a T-shape, the width of the overlap 161 beyond the emitter window 162 being photolithographically aligned, as in double-polysilicon technology.

c) Vertically Insulated Monocrystalline Base Connection Region Technology

FIG. 3 shows a cross-section of a third bipolar transistor according to the prior art. A section of the inner transistor regions is shown schematically, as are the adjacent base connection and collector connection regions. The transistor in FIG. 3 has a single-polysilicon structure with a differentially deposited base, which in contrast to the transistor shown in FIG. 2 permits the formation of a monocrystalline base connection region and has a reduced parasitic base-collector capacitance due to the special structure of the collector region.

A collector 220 is enclosed from below by a substrate 210 and toward the sides by STI regions 211. The collector 220 has a highly doped portion 221 on the substrate side.

The transistor has a first semiconductor electrode which is made of monocrystalline semiconductor material of a second conductivity type and which is disposed in an opening of the insulation region, said electrode being configured either as a collector or as an emitter and having a first vertical portion which is enclosed by the insulation region in a lateral direction perpendicular to the vertical direction, and an adjoining second vertical portion further distanced in the vertical direction from the interior of the substrate, wherein said second portion is not enclosed laterally by the insulation region.

The transistor also has a second semiconductor electrode made of a semiconductor material of the second conductivity type, which is embodied as the other type of semiconductor electrode, i.e., as an emitter or alternatively as a collector, a base made of monocrystalline semiconductor material of the first conductivity type disposed between the collector and the emitter, and a base connection region which has a monocrystalline portion that surrounds the base in the lateral direction and that, seen from the base, laterally surrounds the second vertical portion of the first semiconductor electrode lying further toward the substrate interior, said portion also resting directly on the insulation region with its underside facing the substrate interior, and which is referred to as a vertically insulated monocrystalline base connection region.

Here, the emitter window 262 is positioned self-aligningly with respect to the base connection region and with respect to the SIC, whereas the width of the overlap 261 of the emitter beyond the emitter window 262 and the base connection region 230 is photolithographically aligned.

d) US 2005/006724

FIG. 4 shows a cross-section of a fourth bipolar transistor according to the prior art. A section of the inner transistor region is shown schematically, as are the adjacent base connection and collector connection regions. The transistor shown in FIG. 4 has a structure with a differentially deposited base, said structure being characterized by extensive use of self-aligning methods.

A collector 320 is bounded at the bottom by a substrate 310. In contrast to the preceding embodiments of prior art transistors, the collector 320 is guided over a connection region 321 and under insulation region 311 to the collector contact region 322.

The transistor is formed in a window of a base connection region made of polysilicon 331, said region being opened above the region of the collector 320.

By means of differential epitaxy, a monocrystalline base layer stack 307 and a weakly doped cap layer 308 are deposited over the collector region, while a polycrystalline connection 310 is formed at the side walls of the base connection region.

L-shaped spacers 350, which are likewise formed inside the window in the base connection region 331, separate the emitter 360 from the base connection region 331. In this embodiment, the entire emitter is self-aligning with respect to the opening in the base connection region.

The width of the region of the T-shaped emitter 360 which projects beyond the emitter window 362, said region being separated from a base connection region 309 by the lower part of spacers 350, is aligned with the opening in the base connection region 331 and hence also with the emitter window 362 by the L-shaped spacers 350.

SUMMARY CRITIQUE OF THE PRIOR ART

In the field of double-polysilicon technology, the achieved prior art only permits the emitter window to be positioned self-aligningly with the collector window. No such self-alignment is known in the case of single-polysilicon technology.

As a consequence, it has not been possible until now to self-align the width of lateral overlapping of the generally T-shaped emitter with the base connection region that laterally adjoins the base, in a manner than is independent of other important dimensions of the transistor.

More specifically, it has not been possible to adjust the extent of lateral overhang of the horizontal bar of the T-shaped emitter self-aligningly with the emitter window, without altering the gap between the emitter window and the base connection region at the same time. In particular, the length of the base connection region, which accounts for a significant proportion of the base resistance, is directly related to the width of the T-shaped emitter.

In summary, the emitter cannot be designed and optimized independently of the base connection region.

In known production processes, the position and dimensions of the T-shaped emitter are also adjusted by using a photolithographically positioned mask. This leads to a situation in which the dimensions of the overlap cannot be designed without taking account of the error tolerances associated with the photolithographic process.

It would be desirable to minimize this overlap region, firstly in order to reduce the parasitic capacitance resulting from the area of the overlap. Secondly, the parasitic resistance of the base connection region could also be reduced in this way, in that highly conductive regions of the base connection can be brought closer to the inner base when the overlap is small than is possible in the prior art. Such regions are, for example, silicide, an epitaxial reinforcement of the base connection region or an additional implantation of the base connection in order to increase the doping level.

The known transistor arrangements shown in FIGS. 1, 2, 3 and 4 also illustrate a second aspect that is worthy of criticism: In FIGS. 1, 2 and 4, those parts of the base connection lying on the insulator region consist of polycrystalline material, as a result of which the impedances at contacts and supply lines are noticeably increased in relation to values for monocrystalline material. In FIG. 3, in contrast, the base connection is produced from monocrystalline material. However, it would be desirable to reduce the resistance of the base connection region even further.

The aforementioned disadvantages of the prior art stand in the way of any further improvements in the high-frequency characteristics of a bipolar transistor.

The technical problem addressed by the invention is therefore to specify a semiconductor device for vertical bipolar transistors, in which improved properties for high-speed applications are achieved by reducing or completely preventing the disadvantages of known embodiments, as described above, especially with regard to parasitic capacitances and resistances.

Another technical problem addressed by the invention is to specify a method for producing a bipolar semiconductor device, with which the disadvantages of known methods, as described above, can be reduced or completely prevented, especially with regard to parasitic capacitances and resistances.

DISCLOSURE OF INVENTION

These problems are solved by a semiconductor device according to claim 1, comprising, in one embodiment, a substrate layer made of a semiconductor material of a first conductivity type and having a first insulation region, and a vertical bipolar transistor having

- a first vertical portion of a collector made of monocrystalline semiconductor material of a second conductivity type and disposed in an opening of the first insulation region,
- a second insulation region lying partly on the first vertical portion of the collector and partly on the first insulation region and having an opening in the region of the collector, in which opening a second vertical portion of the collector made of monocrystalline material is disposed, said portion including an inner region of the second conductivity type,
- a base made of monocrystalline semiconductor material of the first conductivity type,
- a base connection region surrounding the base in the lateral direction,
- a T-shaped emitter made of semiconductor material of the second conductivity type and overlapping the base connection region, wherein the base connection region, aside from a seeding layer adjacent the substrate or a metallization layer adjacent a base contact, consists of a semiconductor material which differs in its chemical composition from the semiconductor material of the collector, the base and the emitter and in which the majority charge carriers of the first conductivity type have greater mobility compared thereto.

The semiconductor device according to the invention is distinguished by its bipolar transistor having especially good high-frequency characteristics. These are achieved by a reduced resistance of the base connection region, which due to the inventive structure, especially when using the inventive method described below, is accompanied by an especially low parasitic base-emitter capacitance of the bipolar transistor.

An essential aspect for reducing the base resistance is that the base connection region is a region with particularly good conductivity. In the semiconductor device according to the invention, this is achieved by producing the base connection region, aside from a seeding layer adjacent the substrate or a metallization layer adjacent a base contact, from a semiconductor material which differs in its chemical composition from the semiconductor material of the collector, the base and the emitter, and in which the majority charge carriers of the first conductivity type have greater mobility compared thereto. In the case of a p-conductive base connection region, the material therefore has higher hole mobility and, in the case of an n-conductive base connection region, enhanced electron mobility.

The bipolar transistor according to the invention has a low parasitic base-emitter capacitance due to the inventive option, described further below, of self-aligning production of the lateral overlap of the emitter and the base connection region. The overlap region can be made smaller by eliminating the error tolerances that have to be taken into account when aligning with photolithographic methods, as is otherwise common. Due to the horizontal bar of the T-shaped emitter having a smaller overlap, it is possible for highly conductive portions of the base connection region to be brought particularly close to the inner transistor. These highly conductive portions may, for example, be silicided regions, epitaxial reinforcements of the base connection region, or regions that are more highly doped by implantation.

Basically, this advantage can also be achieved when the base connection region is made from the same material as the functional layers of the inner transistor. When both features are combined, the base connection region of a vertical bipolar transistor is significantly improved with regard to its high-frequency characteristics.

Embodiments of the inventive semiconductor device shall now be described. As can also be seen from the backward references in the attached claims, the additional features of the embodiments can also be combined with each other to form further embodiments, unless these additional features are disclosed as alternatives to each other.

The material of the base connection region is preferably silicon germanium, with a germanium content of more than 35%, i.e., $Si_{1-x}Ge_x$, where x is at least 0.35. Silicon germanium with such a high germanium content is distinguished by a significantly higher hole mobility compared to silicon. In this way, it is possible to achieve a particularly low resistance in the base connection region with materials that are compatible with known industrial production processes. An even stronger effect in this direction can be achieved by using silicon germanium with a germanium content of more than 50% for the base connection region or, with yet further improvement, of more than 80%.

In one embodiment, the material of the base connection region is germanium ("x=1"), whereas the material of the collector, base and emitter is silicon or silicon germanium. Compared to silicon, germanium has an enhanced hole mobility that is as much as ten times higher. Germanium has a significantly increased hole mobility even in comparison with standard variants of silicon germanium.

It should be understood that the comparison of hole conductivities of different materials is based on at least approximately equal dopant concentrations, and that only such dopant concentrations that are within a range of interest for transistor production may be considered.

The use of monocrystalline semiconductor material, as such a material in the base connection region that is different from the material inside the transistor, provides an additional advantage compared to known prior art variants. The base connection region may be wholly or partly monocrystalline in different embodiments of the semiconductor device. For example, the base connection region may contain two subregions, of which only one first subregion in the immediate proximity of the base is monocrystalline, the second subregion being polycrystalline.

An at least partly monocrystalline base connection region ensures improved conductivity compared with polycrystalline material. "Monocrystalline" refers here to portions that have a uniform crystallographic orientation that is either predefined by the substrate or which correspond to one of the other highly symmetric surface orientations, which in the case of silicon are surface orientations (100), (110), (111) or (311). In contrast thereto, "polycrystalline regions" are regions consisting of a plurality of crystallites with different crystallographic orientations, which border each other at grain boundaries and which may have dimensions ranging from a few nanometers to a few hundred nanometers.

Further reduction of the base resistance is made possible by increasing the layer thickness of the base connection region at a certain distance from the inner base.

A buffer layer made of monocrystalline semiconductor material and disposed between the collector and the base is preferred.

A cap layer made of monocrystalline semiconductor material may be disposed between the base and the emitter.

If one views a semiconductor device having a plurality of vertical bipolar transistors with a structure as defined by the invention, what can be achieved is that the emitter is T-shaped, with the horizontal bar of the T-shape outwardly overlapping the respective base connection region, the lateral extension of said overlap having a maximum variation of 10 nanometers over the total number of said bipolar transistors of the semiconductor memory device. Such a homogenous structure in respect of this overlapping may be achieved by the inventive method, as shall now be described.

According to a second aspect of the present invention, a method for producing a vertical bipolar transistor is specified, in which
- a window is produced in the lateral region of the collector, in a layer stack which is partly deposited on a first vertical portion of a collector (420) and partly on an insulator region (411) surrounding the latter,
- a second vertical portion of the collector and a base stack are deposited in the window,
- a base connection region laterally adjoining the base stack is produced,
- a lateral recess extending laterally beyond the window is produced in at least one layer of the layer stack above the base stack, and
- a T-shaped emitter is produced with the lateral recess being filled thereby, a lateral extension of the horizontal T-bar and its lateral overlap with the base connection region being predefined by the lateral recess.

With the method according to the invention, a self-aligning adjustment of the width of overlap of the horizontal bar of the T-shaped emitter over the base connection region is achieved. In this context, self-alignment means that the lateral positioning or structural expansion of a region in relation to previously produced regions is not effected by adjusting a photolithographic mask, but rather that the previously produced regions themselves define the positioning and are used as masking for steps in the process, possibly with spacers provided. In this way, positioning errors are eliminated and dimensions such as distances between regions are defined by well-controlled processes such as layer depositions, which on the whole permits significant reduction of distances and dimensions compared to regions which are positioned in relation to each other with photolithography. The error tolerances in the dimensioning of overlaps, that occur with the lithographic methods used hitherto, do not need to be taken into account in the vertical bipolar transistor according to the invention, thus producing the advantages, already described in the foregoing, of especially low parasitic base-emitter capacitance, which improves the high-frequency characteristics of the transistor.

In one embodiment, the method according to the invention can be carried out in such a way that the base connection region, aside from any seeding layer adjacent the substrate or a metallization layer adjacent a base contact, is produced from a semiconductor material which differs in its chemical composition from the semiconductor material of the collector, the base and the emitter and in which the majority charge carriers of the first conductivity type have greater mobility compared thereto. The advantages of this method have already been described in the foregoing, in connection with embodiments of the inventive semiconductor device. A seeding layer may be used to improve the crystalline properties of the base connection region, in a manner known per se, in particular in the production of a monocrystalline base connection region. However, this is not an absolute necessity. A metallization layer may also be produced without previously covering the base connection region with an additional semiconductor layer, such as silicon, in order to produce a metallization layer made of titanium silicide or cobalt silicide. For germanium, for example, a nickel silicide layer can be produced without having to deposit a silicon layer before forming the silicide. However, it is possible to dispense with producing the metallization layer for some applications that do not exploit the advantage of the metallization layer.

The method proceeds advantageously, for deposition of the layer stack, from a high-impedance monocrystalline semiconductor substrate of the first conductivity type, which is provided in previous steps of the method with the first vertical portion of a collector region of the second conductivity type, which is laterally bounded by a first insulation region.

There are two alternative variants available for the subsequent execution of the method.

In a first variant, the layer stack is produced in the direction of layer growth such that it either contains or consists of the following combination of layers: a second insulation region, a polycrystalline or amorphous semiconductor layer, an insulating layer, a first auxiliary layer and a second auxiliary layer. A detailed description of an embodiment based on this first variant is described in more detail below, with reference to FIGS. 5-12.

In a second variant, the layer stack is produced in the direction of layer growth such that it either contains or consists of the following combination of layers: a second insulation region, a first auxiliary layer, a second auxiliary layer and a third auxiliary layer. A detailed description of an embodiment based on this second variant is described in more detail below, with reference to FIGS. 13-21.

In the following, embodiments of the first variant shall firstly be described.

The window is preferably formed in the layer stack in such a way that the window extends in the lateral region of the collector from the second auxiliary layer in the depth direction as far as the boundary surface between the semiconductor layer and the second insulation region. This permits subsequent access to the second insulation region in order to produce the second vertical portion of the collector-base stack in the inner transistor region.

However, before the second insulation region in the region of the window is opened in order to produce the second vertical portion of the collector, spacers are advantageously formed on the inner walls of the window. By means of the spacers, it is possible to adjust the lateral expansion of a SIC region which is preferably formed in the upper vertical portion of the collector in a subsequent implantation step. They also prevent any lateral "growth" of the window, in particular in the region of the semiconductor layer of the layer stack. Implantation of the SIC region may basically be carried out before or after a base stack is deposited in the window.

The spacers are also helpful for further execution of the method, however. In the further course of the method, the spacers are therefore removed only partly from the side wall of the semiconductor layer that will form the base connection region, followed by selective epitaxial deposition of the base stack in the region of the window. In one embodiment, the base stack consists of a buffer layer, a base layer and a cap layer. Deposition is now carried out preferably in such a way that a polycrystalline inner region of the base connection region is simultaneously produced at the side wall of the semiconductor layer. This can be achieved, for example, by attacking the spacers from below as well when partly removing them, so that in the region of the semiconductor layer they are fully removed in some portions.

In this first variant, the recess in one embodiment can be produced by selective, lateral etch-back of the first auxiliary layer in the region of the window, such that a lateral recess extending beyond the window is produced in the first auxiliary layer. This means that the T-shaped emitter is then deposited self-aligningly in the window and in the recess in the first auxiliary layer, wherein the width of the lateral overlap of the emitter and the base connection region, beyond the lateral extension of the window, results in a self-adjusted manner, in accordance with the invention, from the width of the etch-back of the first auxiliary layer.

Embodiments of the second variant shall now be described.

Here, too, the window is preferably formed in the layer stack in such a way that the window extends in the lateral region of the collector region in the depth direction as far as the first vertical portion of the latter. Selective epitaxial deposition of a second vertical portion of the collector is then preferably carried out in the region of the window and a base stack. In one embodiment, the base stack consists, in the direction of growth, of a buffer layer, a base layer and a cap layer. The layer stack preferably grows to such an extent that the base layer stack extends, in the direction of growth, at most to the underside of the first auxiliary layer.

In this second variant, selective, lateral etch-back of the second auxiliary layer in the region of the window is preferably carried out, such that a lateral recess extending beyond the window is produced in the second auxiliary layer.

In this way, the T-shaped emitter can be deposited in the window and in the recess in the second auxiliary layer in a self-aligning manner, wherein the width of the lateral overlap of the emitter and the base connection region, beyond the lateral extension of the window, results in a self-aligning manner due to the width of the etch-back.

The second variant of the method is subsequently continued in advantageous manner with the following steps:
  removing the third auxiliary layer and covering the emitter with a fourth auxiliary layer,
  structuring the second and fourth auxiliary layers in such a way that they are only present in the region of the desired base connection region,
  etching back the first auxiliary layer underneath the second auxiliary layer, to such an extent that the side wall of the base is exposed, and
  producing the base connection region by selective epitaxial growth.

In this embodiment, only part of the base connection region is initially grown by selective epitaxial growth, after which the vertical distance between the insulating layer and the second auxiliary layer is increased by isotropic etching, so that the remaining part of the base connection region is produced by selective or differential epitaxy. It is possible in this way to achieve a greater outward layer thickness for the base connection than in the inner region, as a result of which the resistance of the base connection region can be reduced.

BRIEF DESCRIPTION OF THE DRAWINGS

Further features and advantages of the invention can be seen from the following description of embodiments, with reference being made to the Figures, in which.

DETAILED DESCRIPTION

Example 1

A first embodiment of a semiconductor device comprising a vertical bipolar transistor, in which the overlap between the emitter contact and the base connection region is produced self-aligningly with respect to the emitter window, shall now be described with reference to FIG. 5, which shows a cross-sectional view of this first embodiment.

In this example, a vertical NPN bipolar transistor is produced on a high-impedance, monocrystalline P conductive type Si substrate 410. However, the arrangement described here is not limited to P conductive type Si substrates. The essential features can also be applied to substrates of the opposite conductivity type. CMOS transistors may also be simultaneously present on substrate 410, but are not shown in FIG. 5.

Figure 1:
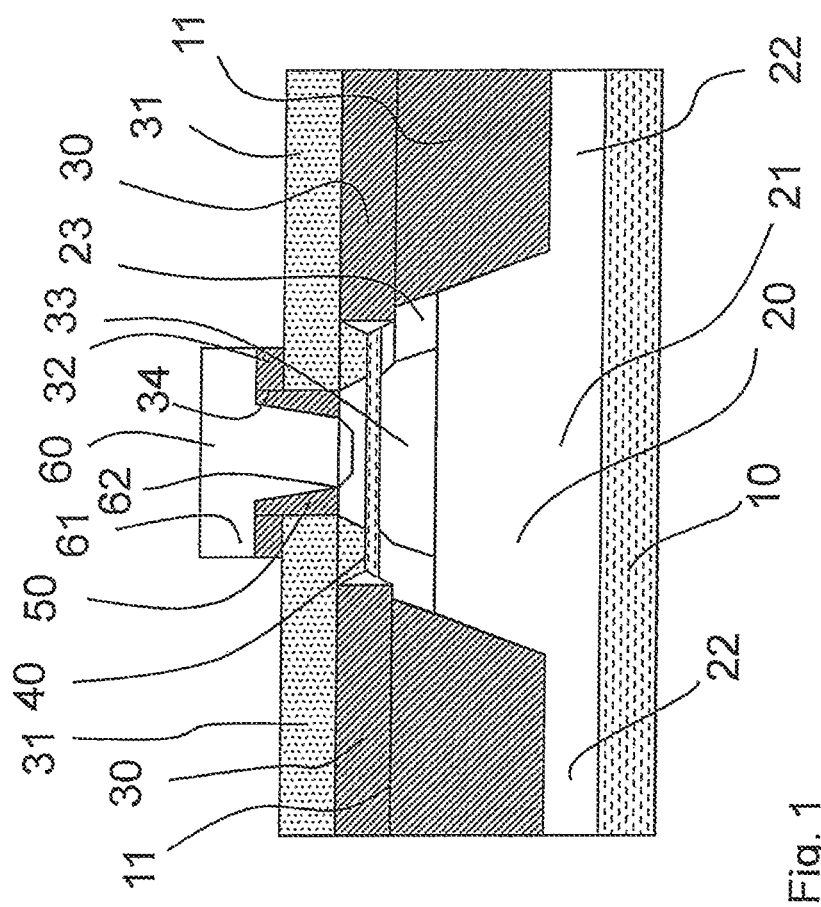
FIG. 1 shows a cross-section of a vertical bipolar transistor produced using double-polysilicon technology in accordance with the prior art.
Figure 2:
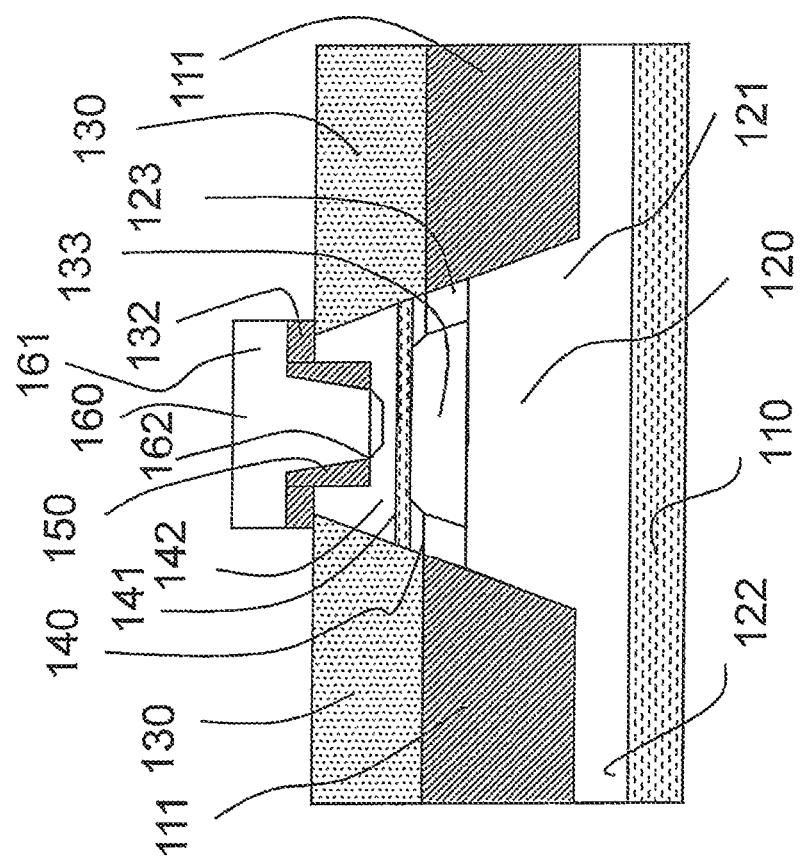
FIG. 2 shows the cross-section of a vertical bipolar transistor produced in single-polysilicon technology in accordance with the prior art.
Figure 3:
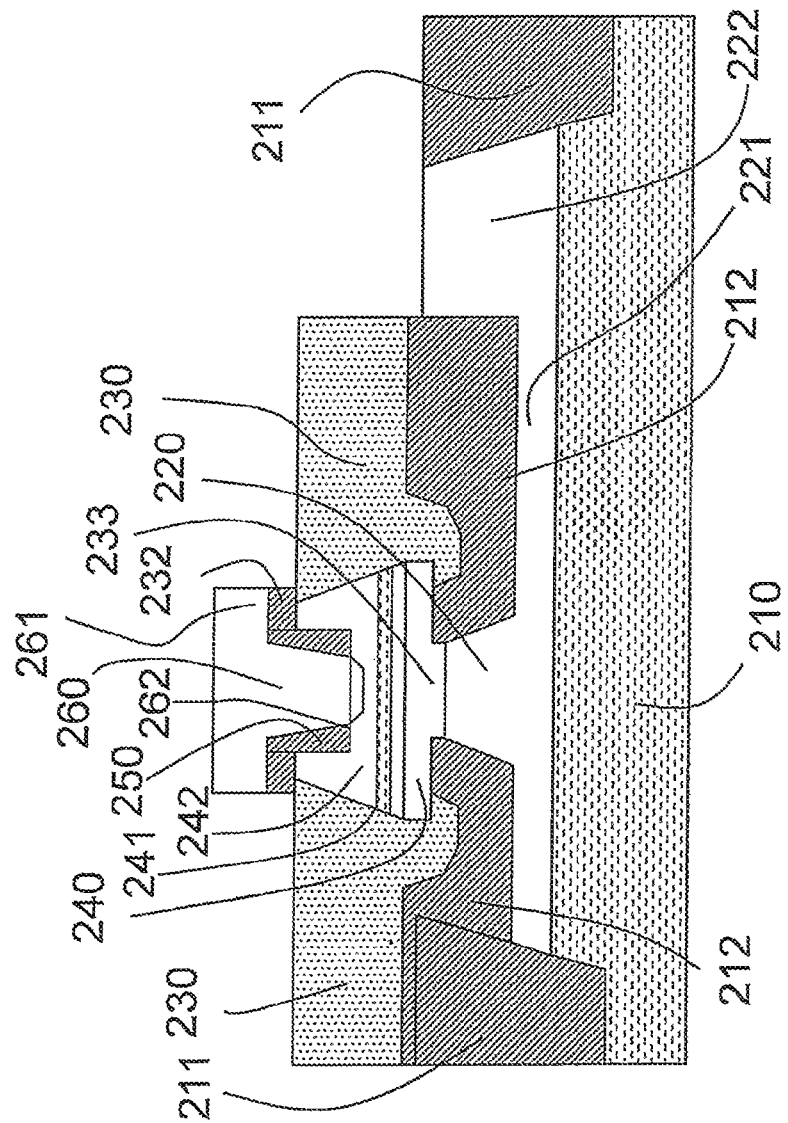
FIG. 3 shows a cross-section of a vertical bipolar transistor produced using vertically insulated monocrystalline base connection region technology in accordance with the prior art.
Figure 4:
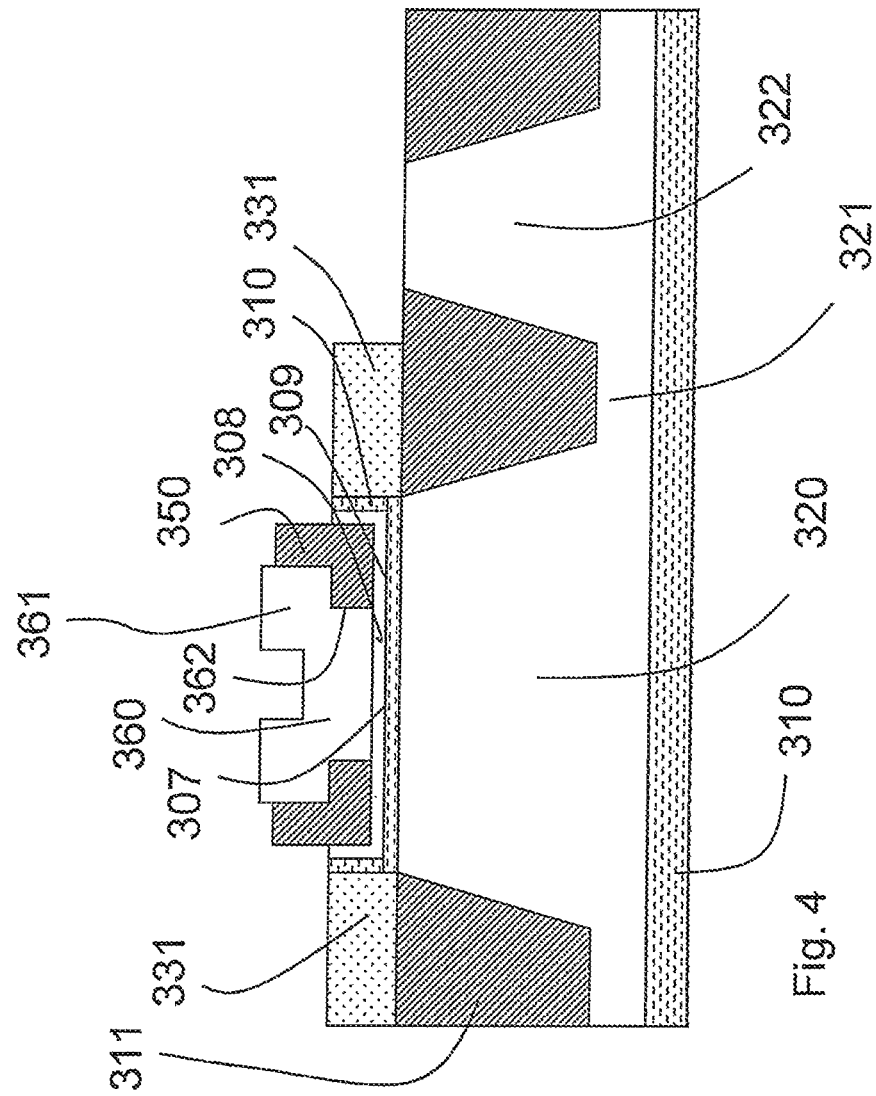
FIG. 4 shows a cross-section of a vertical bipolar transistor according to the prior art in US 2005 006724.
Figure 5:
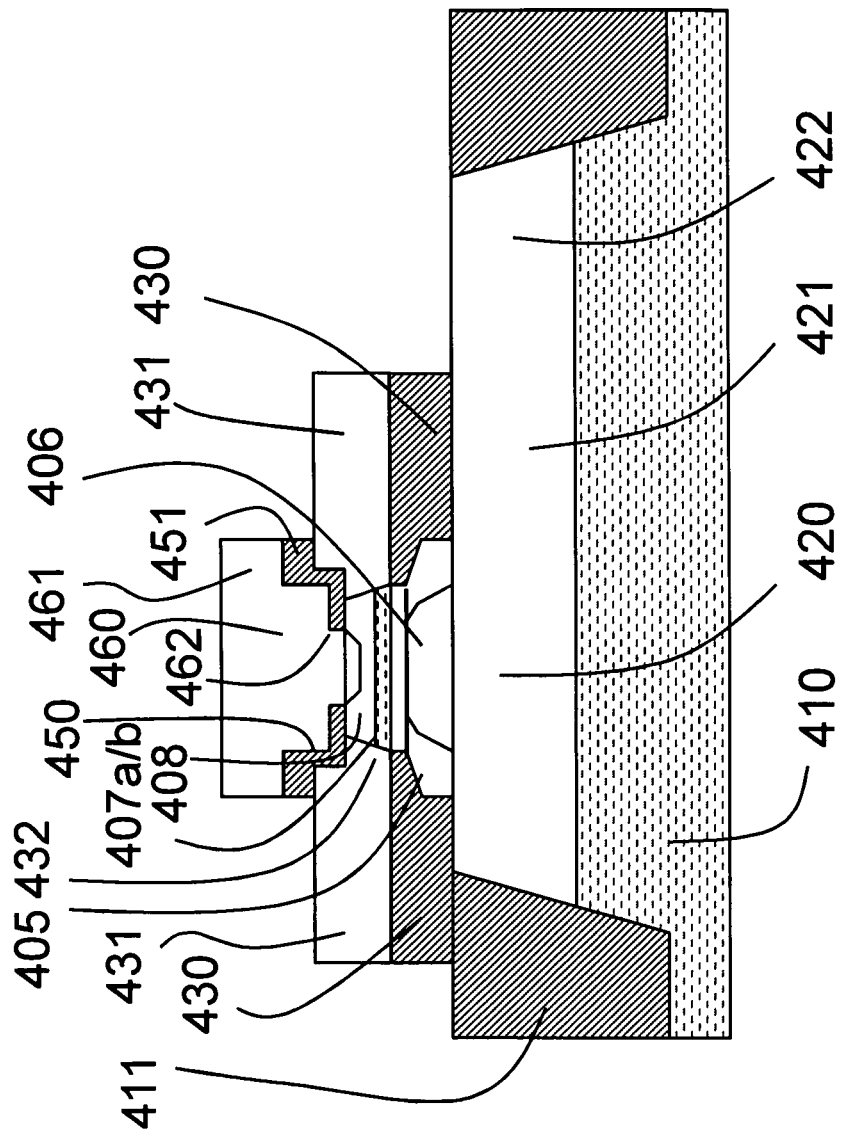
FIG. 5 shows a cross-section of a first embodiment of a vertical bipolar transistor according to the invention.

The vertical NPN bipolar transistor shown in FIG. 5 comprises an N conductive type lower collector region 420, which forms a first vertical portion of a collector of the bipolar transistor, and a likewise N conductive type emitter 460. The collector is laterally connected via a collector connection region 421 to a collection contact region 422. Contact structures such as the emitter-base and collector contact are not shown graphically in FIG. 5 for the sake of simple presentation.

A monocrystalline layer stack is disposed between emitter 460 and the lower collector unit 420, said stack containing an upper collector region 405 as a second vertical portion of the collector, a base layer stack 407 consisting of a buffer layer 407a and base layer stack 407b, and a cap layer 408.

The second vertical portion of collector 405 is produced by selective epitaxial growth on collector 420 in the region of a window in insulating layer 430 and may have a thickness of 5 nm to 200 nm, preferably 60 nm to 150 nm. The second vertical portion 405 is n-doped in an inner region 406. Outside inner region 406, the second vertical portion 405 is weakly n-doped or weakly p-doped. The n-doping in inner region 406 is produced by ion beam implantation. The inner region is also referred to as a "SIC region".

Base layer stack 407 initially contains a buffer layer 407a. This layer may be 5 nm to 120 nm, preferably 30 nm to 70 nm thick. The p-doped base layer 407b is produced above the buffer layer. The thickness of the base layer may be 5 nm to 100 nm, preferably 10 nm to 50 nm. Above the base layer stack lies a cap layer 408 that is preferably 5 nm to 100 nm, preferably 10 nm to 50 nm thick, which is likewise produced by selective epitaxial growth.

Base 407 can preferably be provided in the form of a SiGe alloy. Carbon may also be incorporated in buffer layer 407a, in base layer 407b or in cap layer 408 during epitaxy.

A polycrystalline layer comprising base connection regions 432 and 431 adjoins layers 407 and 408 laterally outwards. The inner base connection region 432 ensues during epitaxial growth of layers 407 and 408 and has a lateral extension of 5 nm to 150 nm and a vertical extension of 5 nm to 150 nm. The outer base connection region 431 has a thickness of 20 nm to 200 nm, preferably 50 nm to 150 nm.

A first type of insulation region 411, referred to hereinafter as field insulation regions, projects into the interior of the substrate and laterally bounds the lower collector 420. "Shallow trench" isolations are used, such as those known from CMOS technology. These are preferably trenches with a depth of 250 to 600 nm, which may be filled with silicon dioxide ($SiO_2$), for example, or also with a combination of insulator material and polysilicon. Alternatively, field insulation regions produced by local oxidation (LOCOS) may also be used. In addition to the shallow field insulation regions, deep trenches filled with $SiO_2$, for example, can be used, although these are not provided in the arrangement shown in FIG. 5.

The first insulating layer 430 is 20 nm to 200 nm thick and lies partly on insulation region 411 and partly on collector 420. The insulation layer preferably consists of an insulator material with a low dielectric constant. Silicon dioxide ($SiO_2$), or a different "low-k" material may be used for this purpose.

A second structured insulating layer 451 is provided above the layer stack consisting of first insulating layer 430 and base connection region 431. This may preferably consist of a $SiO_2$ layer with a thickness of 10 nm to 150 nm, preferably 30 nm to 120 nm. However, it may also be composed of a combination of different insulator materials.

An approximately L-shaped spacer 450 consisting of insulation material ensures the electrical insulation of emitter 460 from base connection region 431 and 432. The exact profile of the spacer is not exactly L-shaped, as can be seen from the Figures. The spacer could also be described, somewhat more precisely, as Z-shaped or as double L-shaped, but is referred to here as L-shaped, in accordance with the custom in the art, without confining it thereby to an exact L-shape.

The opening formed by spacers 450 above cap layer 408 defines the emitter window 462. A highly doped silicon layer of the same conductivity type as the collector, the NPN emitter layer 460, covers the emitter window, spacers 450 and insulator layer 451. The NPN emitter layer 460 may be deposited as a polycrystalline, amorphous, partially monocrystalline, partially polycrystalline or as a monocrystalline material and in its final state is polycrystalline, monocrystalline or is polycrystalline or monocrystalline in subregions. During a high-temperature step, n-dopant may be diffused out of the highly doped NPN emitter layer 460 through the emitter window into cap layer 408, as indicated by an arcuate line in cap layer 408 directly below the emitter. In this case, the emitter comprises the NPN emitter layer 460 and the diffused n-region.

In a silicidation step that then follows, silicide layers with even better conductivity compared to highly doped Si are formed. In a final step, the surface of the transistor and insulation regions is covered with an insulator layer or combination of insulator layers. Contact holes filled with conductive material, and metal strips lying above them provide the electrical connection to the contact regions of the transistor.

A method for producing the inventive semiconductor device, as described above in said example, shall now be described with reference to FIGS. 6 to 12.

A substrate 410 (FIG. 6), preferably monocrystalline p-conductivity type silicon with a high ohmic resistance (slight p-type doping), forms the basis for production. Processing of substrate 410 begins by generating field insulation regions 411. In the present example, "shallow trenches" are used as field insulation regions. Islands of Si regions created between the field insulation regions form active regions. When the vertical bipolar transistor has been completed, the active region will accommodate collector region 420, collector connection region 421 and collector contact region 422.

Collector region 420 is doped by ion implantation into the silicon after the field isolation regions have been completed.

Figure 6:
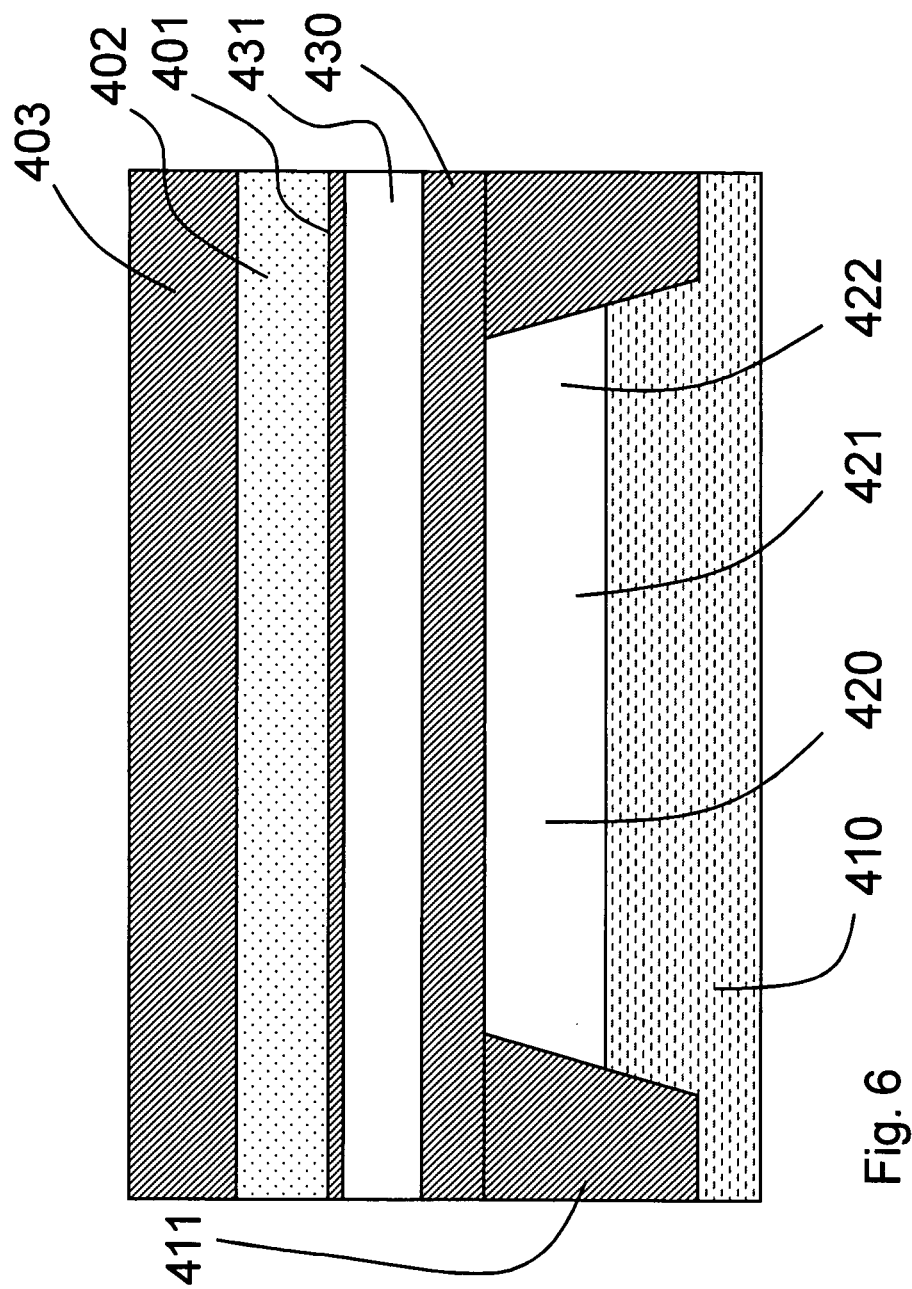
FIGS. 6-12 show cross-sections of the vertical bipolar transistor in FIG. 5 in different stages of an embodiment of a method for its production.

FIG. 6 shows a snapshot during production of the bipolar transistor. Field insulation regions 411 and collector region 420 have already been made. A layer stack, consisting in this embodiment of an insulation layer 430 which forms a second insulation region, a semiconductor layer 431, a further insulation layer 401, a first auxiliary layer 402 and a second auxiliary layer 403, has also been produced and covers the entire wafer. Insulation layer 401 preferably consists of $SiO_2$ and has a thickness of 20 nm to 200 nm, preferably 80 nm to 120 nm. Semiconductor layer 431 preferably consists of polycrystalline, p-doped silicon and has a thickness of 20 nm to 200 nm, preferably 80 nm to 120 nm. Insulation layer 401 preferably consists of $SiO_2$ and has a thickness of 10 nm to 100 nm, preferably 30 nm to 70 nm. The first auxiliary layer 402 preferably consists of $Si_3N_4$ and is 100 nm to 200 nm, preferably 130 nm to 170 nm thick. The second auxiliary layer 403 preferably consists of $SiO_2$ and is 150 to 250, preferably 170 nm to 210 nm thick. It should be noted, for all layer thicknesses, that they cannot be selected independently of each other or of other process parameters, especially those of etching processes.

In one variant of the invention, the second auxiliary layer 403 may be dispensed with in favor of a greater layer thickness of the first auxiliary layer 402. The initial layer thickness of the first auxiliary layer should then take into account the rate of removal of the first auxiliary layer in an etching process, described below, to form a window 400, and in an etching process to form a lateral recess in the first auxiliary layer in the region of the window. However, it is assumed for the following description that a second auxiliary layer 403 is present.

A window, referred to in the following as a transistor window, and structured in a standard photolithographic process, is produced with the aid of standard anisotropic dry etch processes in layers 403, 402, 401 and 431. Ideally, the final dry etch process is designed in such a way that layer 431 is selectively etched to $SiO_2$ and that etching therefore stops at insulating layer 430.

Figure 7:
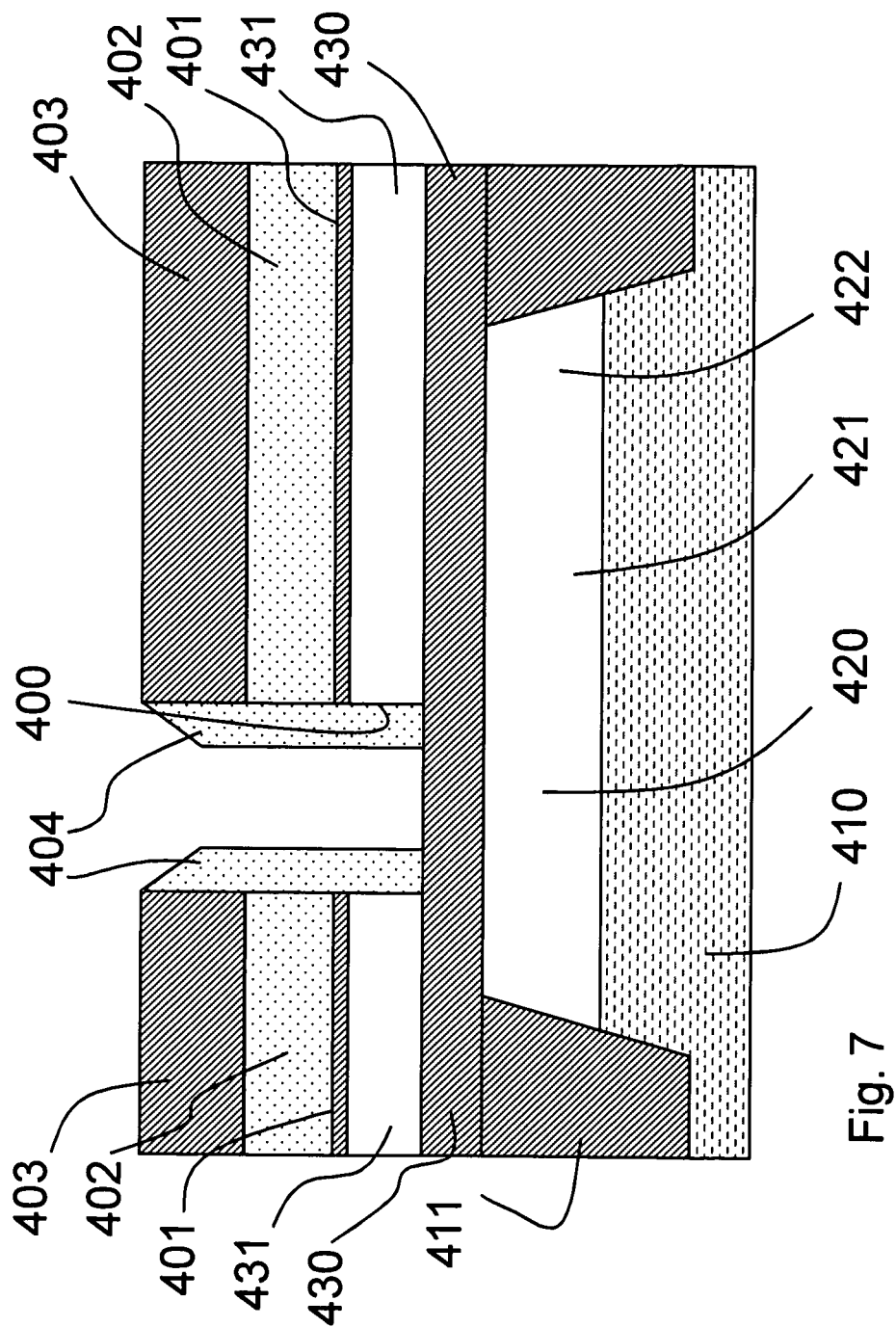

Inside the transistor window, spacers 404, preferably consisting of $Si_3N_4$, are produced by layer deposition and subsequent anisotropic dry etching. The moment immediately after the spacers have been made is shown in FIG. 7. The spacers are 50 nm to 130 nm wide, preferably 70 nm to 110 nm.

In the region of the transistor window, the second insulation region 430 is now opened as well. This is preferably done with a combination of dry and wet chemical etching. Dry etching removes the major part of the material anisotropically. The surface of the silicon of collector 420 is then exposed by wet chemical etching. Wet chemical etching is preferable here because it is particularly gentle on the silicon surface when exposing it, due to high selectivity and the absence of any damage caused by ionizing radiation.

Figure 8:
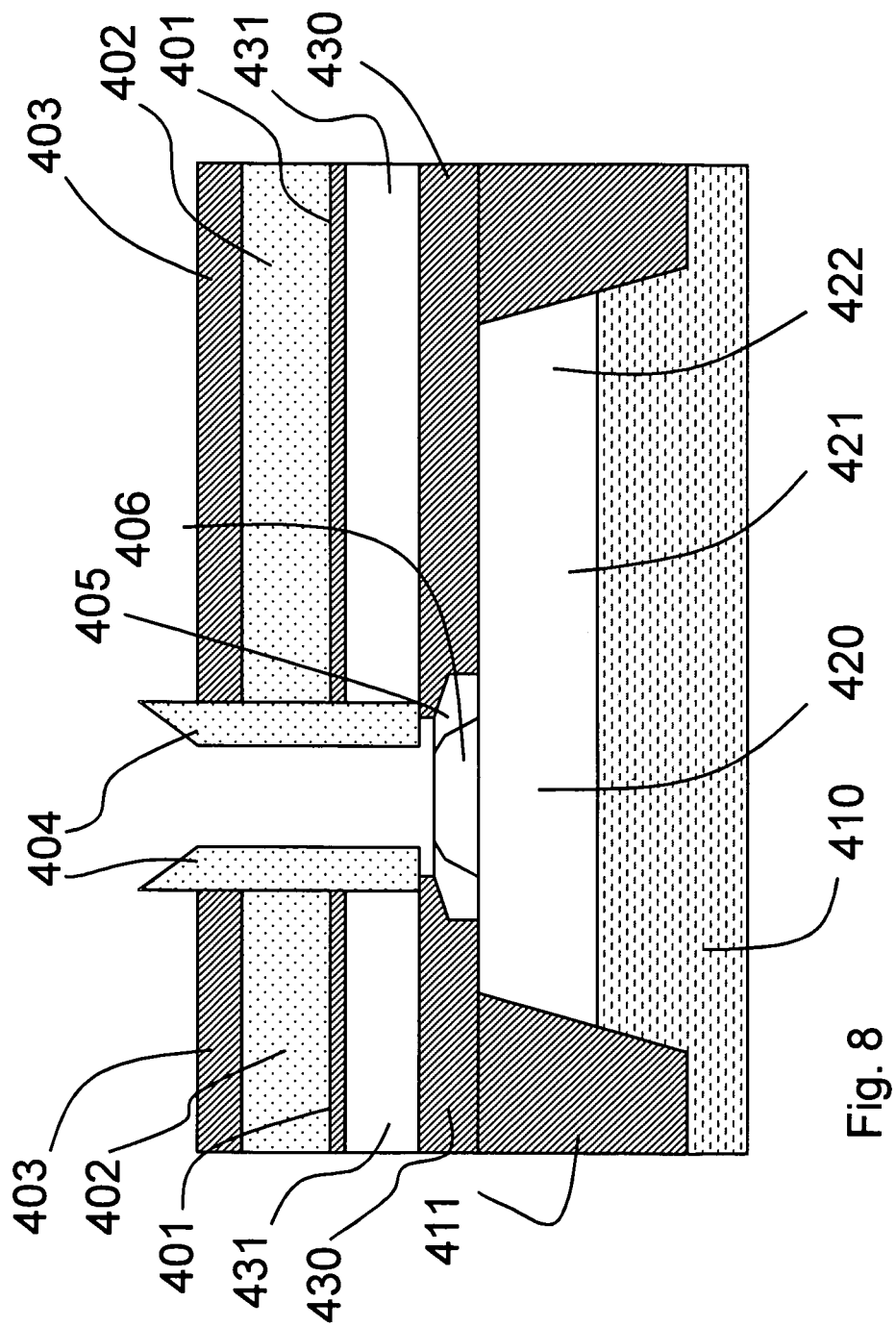

It is possible to produce the layer 430 to be opened from a layer stack consisting of two layers, wherein the combination of layer materials and etchant are chosen such that a lower of the two layers has a higher etching rate than an upper of the two layers in the wet chemical etching process being used. In this case, isotropic wet chemical etching produces a profile as indicated in FIG. 8. In this profile, the opening in layer 430 widens in the downward direction, i.e., in a direction toward the substrate interior. This profile may have advantages for the finished transistor, in the form of lower collector resistance and lower collector-base capacitance.

It should be noted at this point that auxiliary layer 403 is likewise affected by etching of layer 430, and that layer removal must be taken into account when adjusting the initial layer thickness.

The next step is to produce a monocrystalline semiconductor layer 405 on the exposed silicon surface of the collector in the region of the transistor window opening by selective epitaxial growth. Said layer is 5 nm to 200 nm, preferably 60 nm to 150 nm thick. Selective growth means that no material is deposited on the materials of which spacers 404 and auxiliary layer 403 consist.

An inner region 406 of layer 405 is doped with n-type dopant by ion beam implantation. FIG. 8 shows a snapshot of this stage in production. An outer region adjacent the n-doped inner region is preferably weakly n-doped or weakly p-doped in order to achieve advantages with regard to capacitance. This doping is typically performed at the same time as layer 405 is deposited.

In a wet chemical etching process, spacers 404 are now partly removed from the side wall of semiconductor layer 431 facing toward the inner side of the window. In a lower region of semiconductor layer 431, the spacers are entirely removed in this step. To allow this to happen, it is possible to choose the thickness of grown layer 405, for example, or to retract its surface later, in such a way that the spacers are also attacked from below in an etching process.

In a following step of selective epitaxial deposition of base layer stack 407 and of cap layer 408, a polycrystalline inner base connection region 432 is simultaneously created that connects the outer base connection region 431 to base 407*b*.

Figure 9:
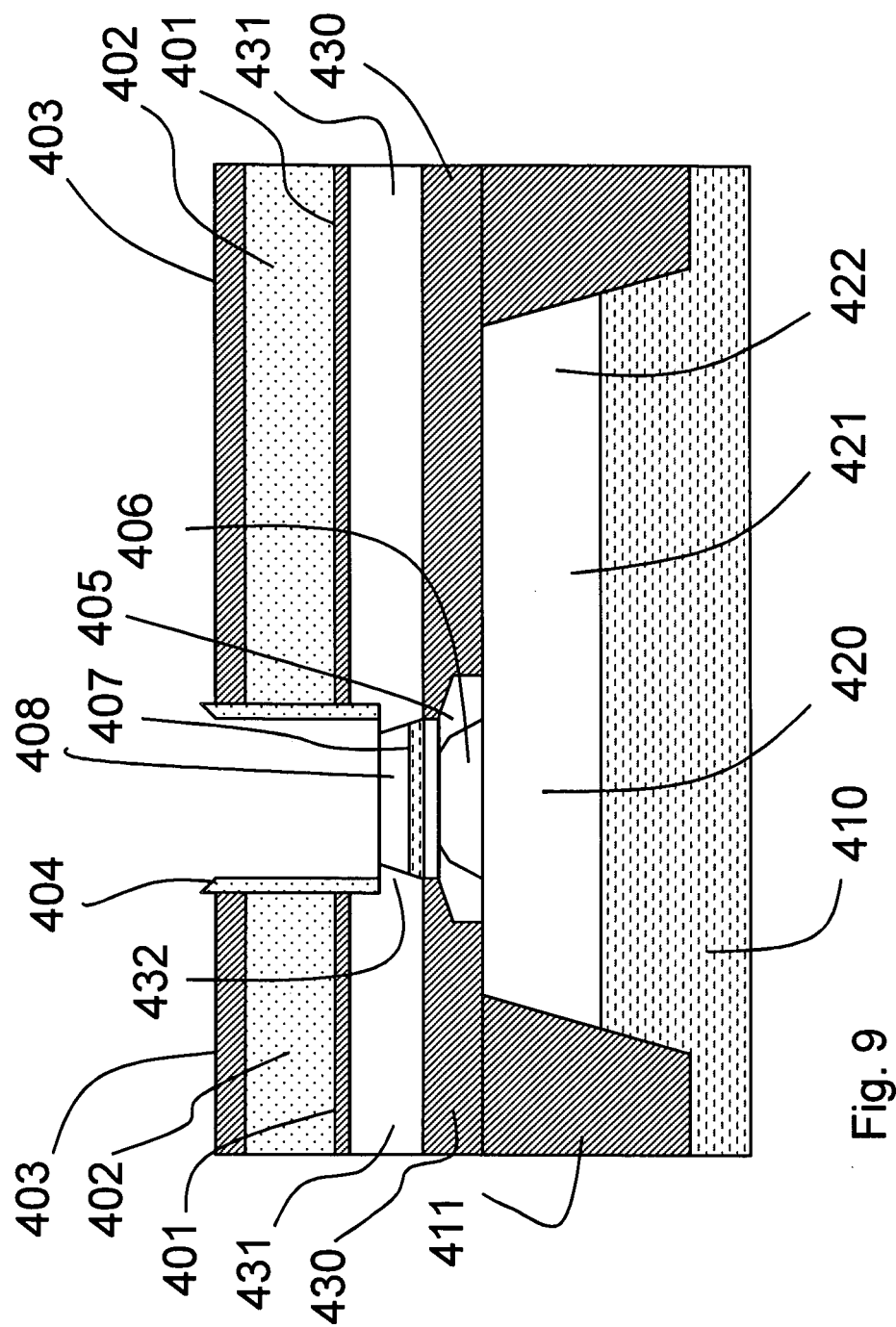

The stage in production after epitaxial deposition is shown in FIG. 9.

Figure 10:
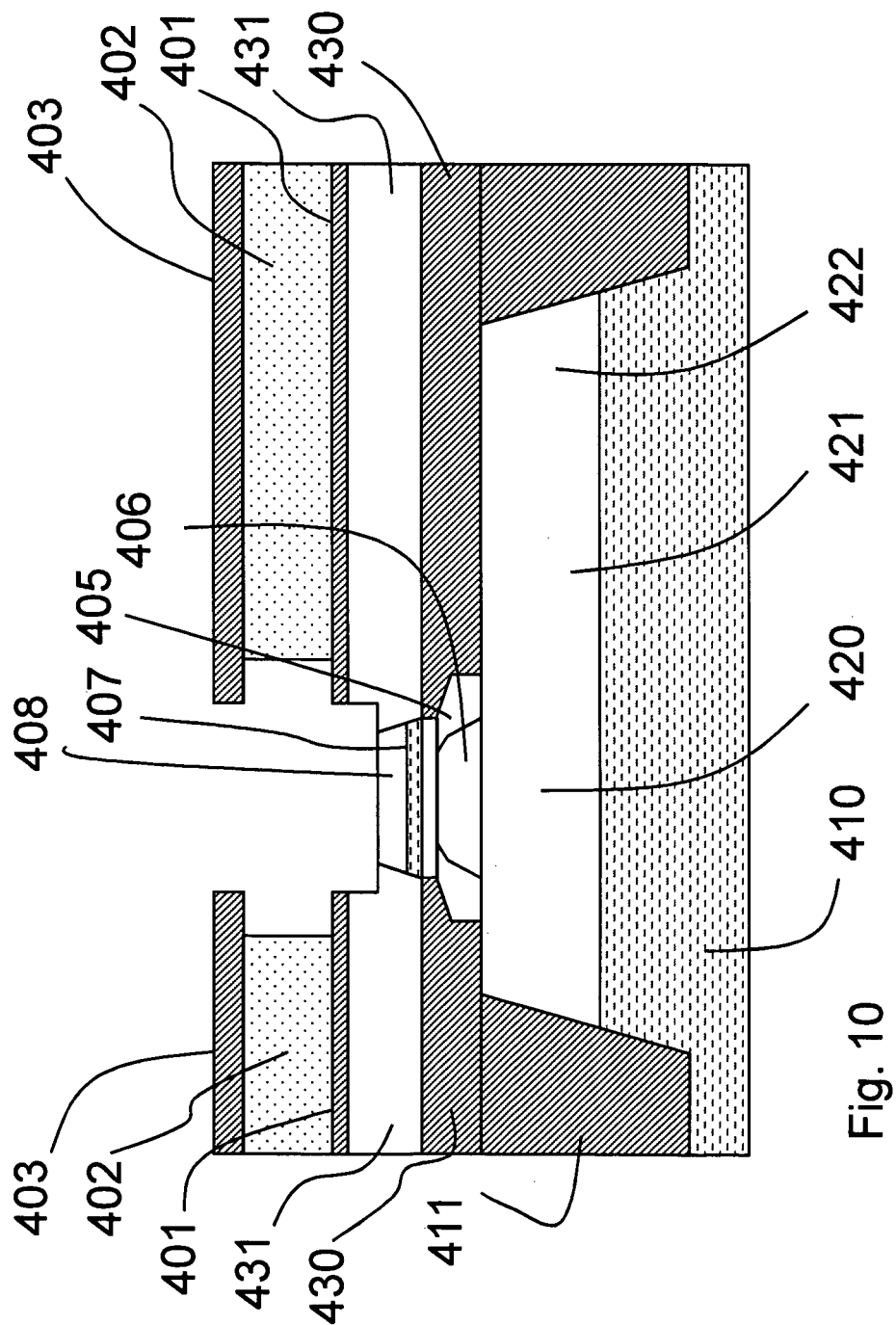

In a wet chemical etching process that now follows, spacers 404 are completely removed, and auxiliary layer 402 is laterally removed to produce a recess between layers 401 and 403. The depth of this recess in the lateral direction, which can be adjusted by varying the duration of the etching process, determines the later overlap of emitter contact 460 and base connection region 431. The overlap is therefore positioned self-aligningly with respect to the other regions of the bipolar transistor produced in the transistor window. FIG. 10 shows a snapshot after the epitaxial deposition process.

Inside the transistor window, spacers consisting of a first spacer layer 450 and a second spacer layer 409 are now produced once again by layer deposition and subsequent, mainly anisotropic etching. The last etching step, which exposes the surface of cap layer 408, is preferably effected by wet chemical etching in order to protect the surface of cap layer 408.

Figure 11:
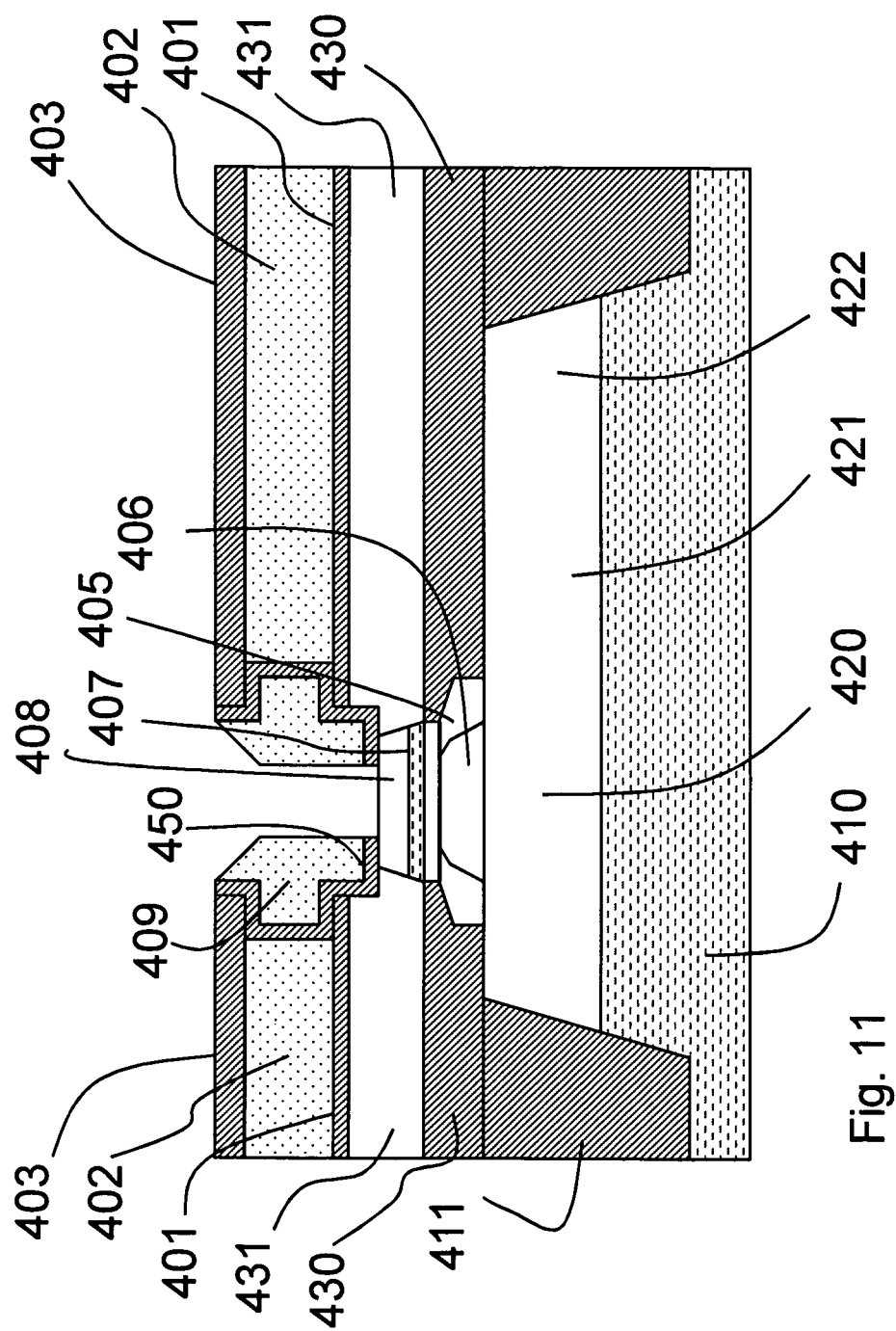

The material of the second spacer layer 409 should be chosen such that it can later be selectively removed to the first spacer layer 450 in an isotropic etching process. The second spacer layer 409 is an auxiliary layer that produces the L-shape of the first spacer layer 450, which is advantageous for the function of the bipolar transistor. The first spacer layer 450 preferably consists of $SiO_2$ and is 20 nm to 80 nm, preferably 50 nm to 70 nm thick. The second spacer layer 409 preferably consists of $Si_3N_4$ and is 50 nm to 130 nm, preferably 70 nm to 110 nm thick. The moment after wet chemical exposure of the surface of cap layer 408 is shown in FIG. 11.

Figure 12:
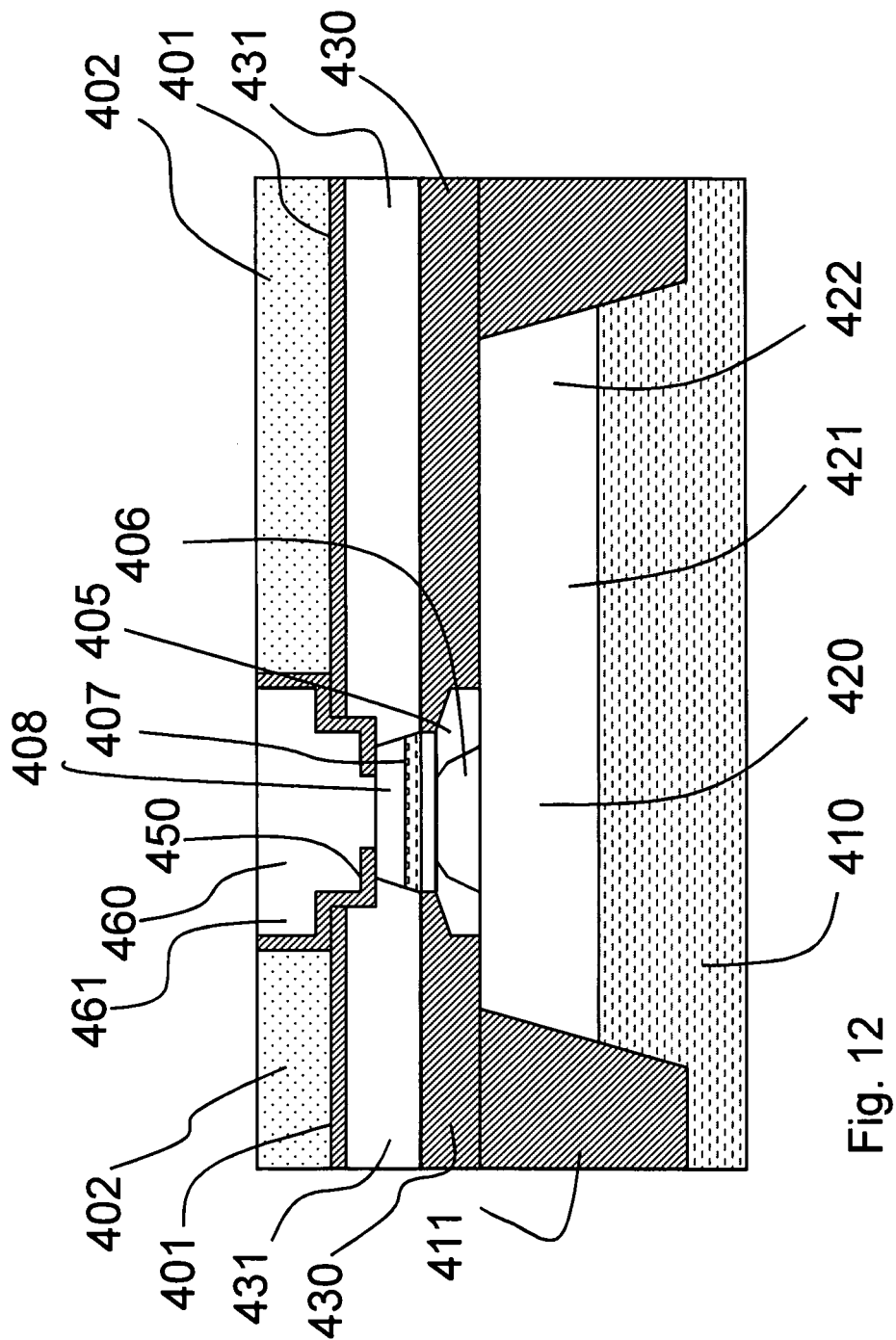

The second spacer layer 409 is now removed in a wet chemical etching process. An n-doped semiconductor layer is then deposited that later forms emitter 460. Deposition may be carried out either as selective deposition of a monocrystalline layer, as deposition of a polycrystalline layer, as differential deposition producing a monocrystalline material on cap layer 408 and polycrystalline material on all other regions, or as differential deposition producing monocrystalline material on cap layer 408 and amorphous material on all other regions. In the case of purely polycrystalline or differential deposition, material deposited outside the transistor window on auxiliary layer 403 is removed immediately after deposition by chemical-mechanical polishing (CMP). Auxiliary layer 403 is also removed by the CMP step and the following etching steps for cleaning the wafer surface. This moment in production is shown in FIG. 12.

The following steps are now needed to finish the transistor in the form shown in FIG. 5.

Auxiliary layer 401, insulating layer 401 and base connection region 431 are firstly structured with the aid of a photolithographically produced photoresist mask in such a way that the base connection region obtains its final form. This structuring is effected using standard dry etch processes.

In a further step, auxiliary layer 402 is selectively removed to the exposed $SiO_2$ and Si layers in a wet chemical etching process.

Finally, insulating layer 401 is then removed from the surface of the base connection region and insulating layer 430 is removed from the surface of collector contact region 422 in a preferably anisotropic dry etch process that removes the $SiO_2$ as selectively as possible with respect to the exposed silicon regions, such as that of the emitter.

In the rest of the procedure, the bipolar transistor is finished by producing a high level of n-doping (not shown) in the region of collector contact region 422, preferably by ion beam implantation, by production of a silicide (not shown) to reduce parasitic resistances on the emitter, base and collector contact regions (not shown), and finally by producing contacts in the form of metal contacts (not shown) that connect the bipolar transistor to a system of external conducting lines separated from it by an insulating layer.

Example 2

Figure 13:
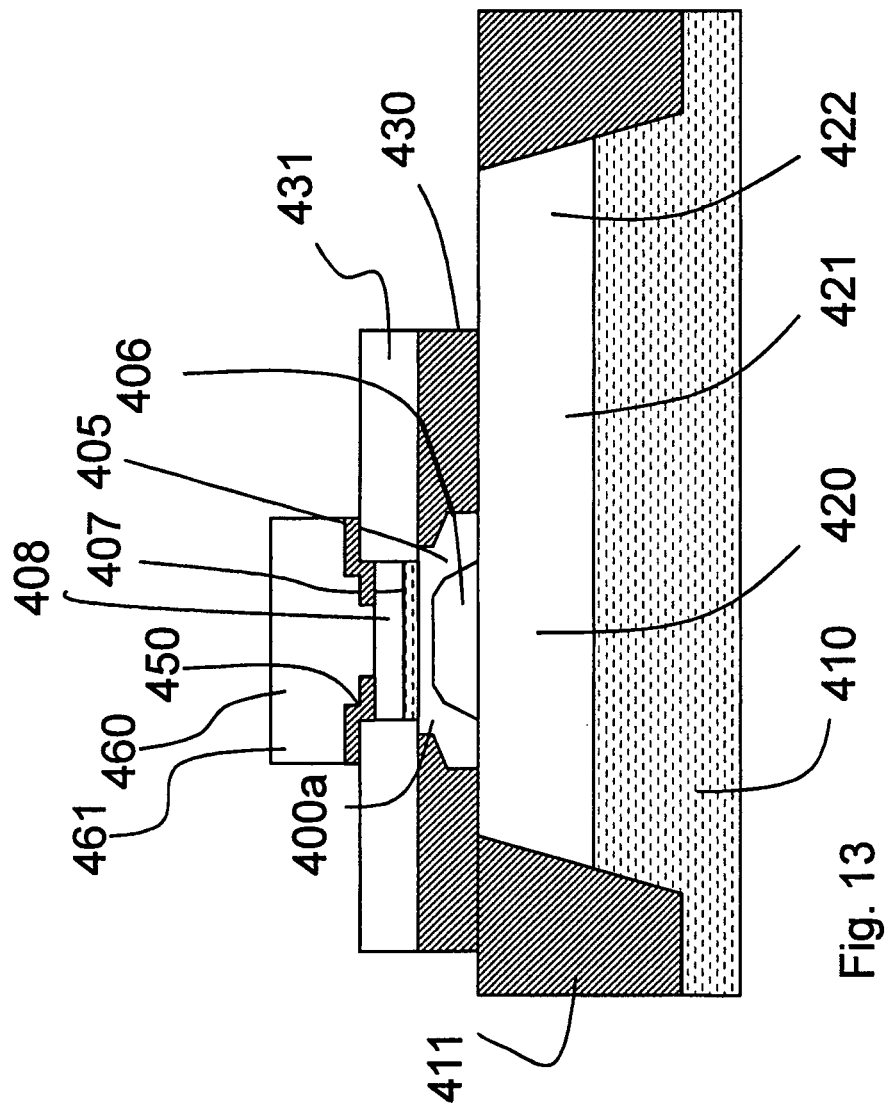
FIG. 13 shows a cross-section of a second embodiment of a vertical bipolar transistor according to the invention.
Figure 19:
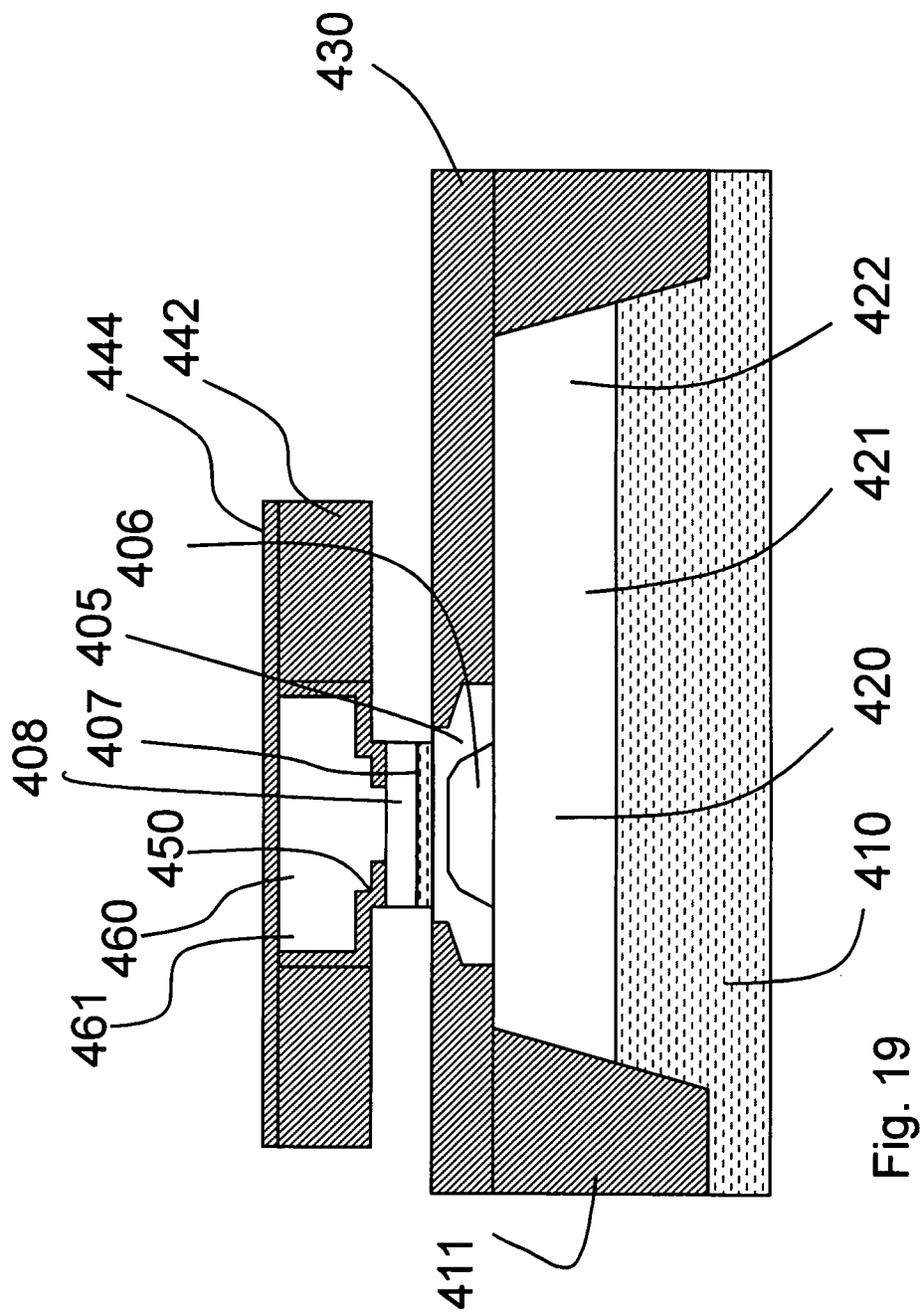
Figure 20:
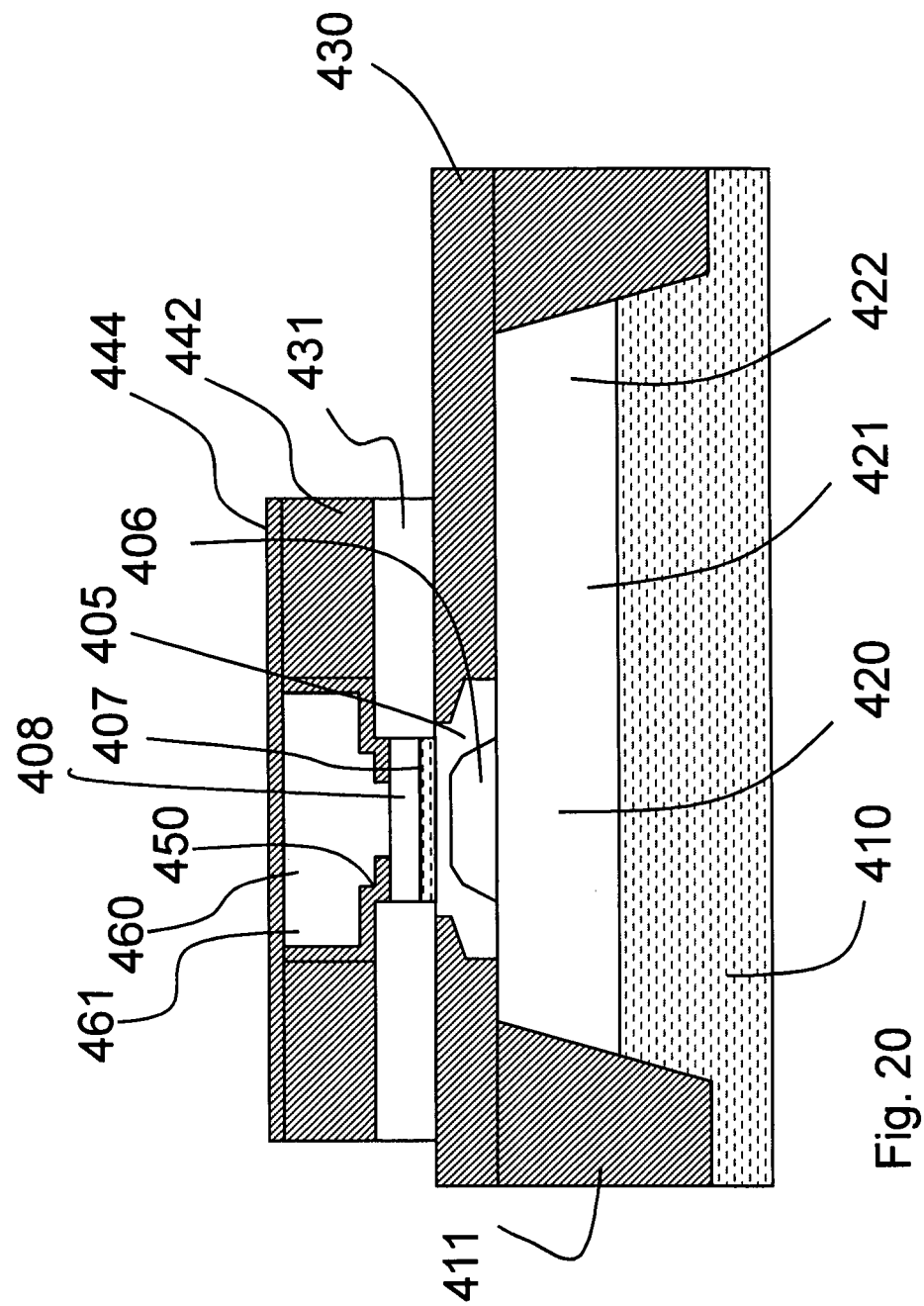
Figure 21:
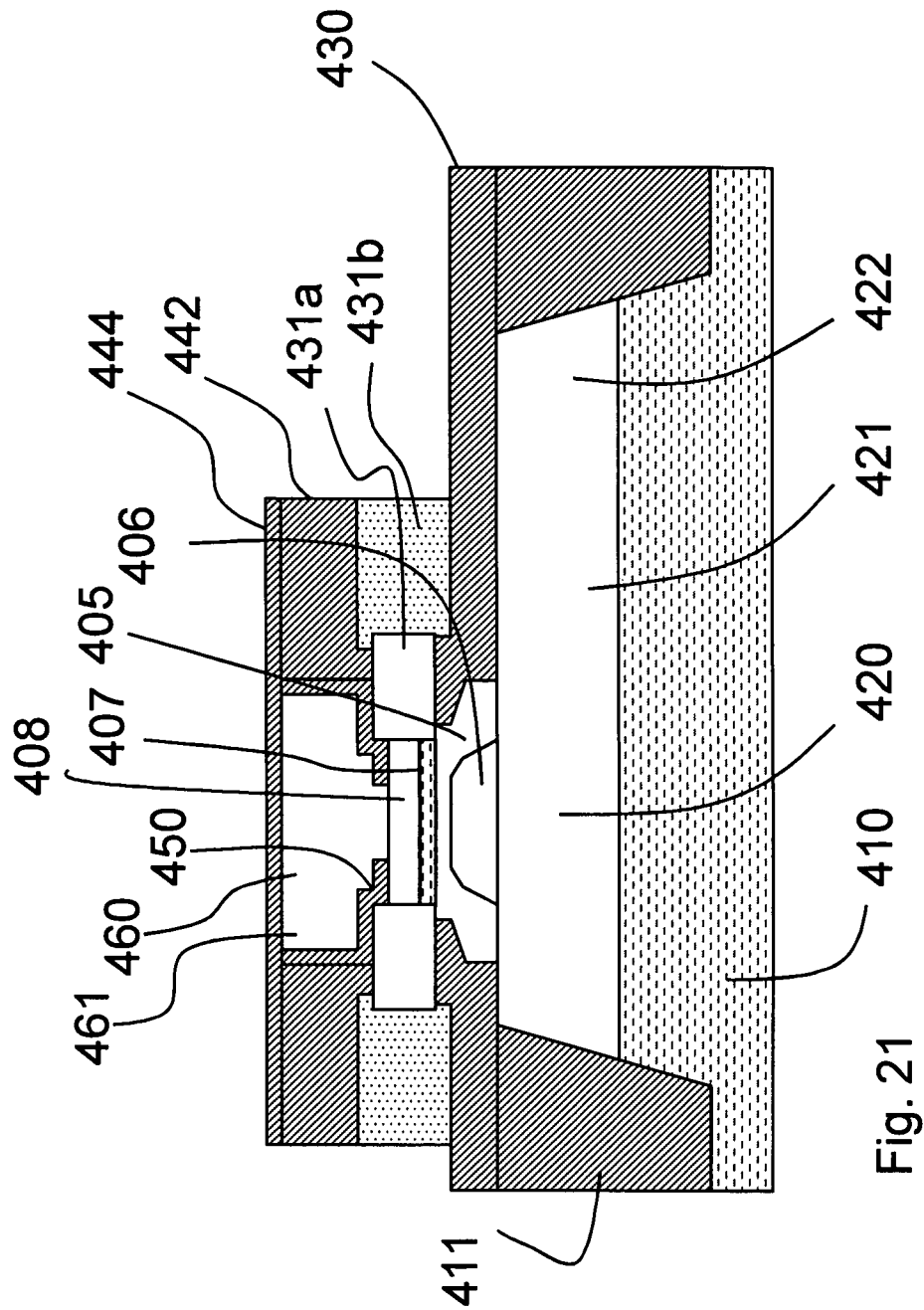
FIG. 21 shows a cross-section of an alternative configuration of the second embodiment of the of a vertical bipolar transistor according to the invention.

A second embodiment of a semiconductor device according to the invention, comprising a vertical bipolar transistor in which the overlap between the emitter contact and the base connection region is produced self-alignigly, and in which the base connection region consisting of a different material from that used in the inner transistor may be wholly or partially monocrystalline, shall now be described with reference to FIG. 13 and FIG. 21. FIG. 13 shows a cross-sectional view of this second embodiment. FIG. 21 shows a variant of the second embodiment. In FIGS. 13 to 21, which pertain to the two variants of Example 2, the same reference signs are used for the same structural elements as in Example 1 and FIGS. 5 to 12.

The structure of the vertical bipolar transistor in this second embodiment is identical in many respects and in both variants to that of the first embodiments, with the exception of the following structural features:
  There is no inner polycrystalline portion of the base connection region, which is marked with reference sign 432 in the embodiment shown in FIG. 5. In the embodiment shown in FIG. 13, base connection region 431 directly adjoins base layer stack 407.
  Base connection region 431 is monocrystalline.
  In the variant of the Example shown in FIG. 18, however, the base connection region is only partially monocrystalline. A first region 431a laterally and directly adjoining base stack 407 is monocrystalline, and a second region 431b laterally adjoining region 431a is polycrystalline. The monocrystalline region may be produced by epitaxial growth or by amorphous deposition with subsequent thermal treatment.
  In the variant shown in FIG. 21, the base connection region may be embodied in such a way that the second region 431b has a greater thickness than region 431a, which advantageously reduces the electrical resistance.
  The base connection region, in particular the monocrystalline region, may be produced from a different material from the one used in semiconductor layer 405, in base stack 407 or in cap layer 408. In contrast to known embodiments according to the prior art, this provides an advantage when selecting a material which is suitable with regard to the electrical function of the transistor.

A method for producing the inventive semiconductor device, as described above in said example, shall now be described with reference to FIGS. 14 to 20.

A substrate 410 (FIG. 14), preferably monocrystalline p-conductivity type silicon with a high ohmic resistance (slight p-type doping) forms the basis for production. Processing of substrate 410 begins by producing field insolation regions 411. In the present example, "shallow trenches" are used as field isolation regions. Islands of Si regions created between the field isolation regions form active regions. When the vertical bipolar transistor has been completed, the active region will accommodate collector 420, collector connection region 421 and collector contact region 422.

The doping of collector 420 is performed by ion implantation into the silicon after the field isolation regions have been completed.

Figure 14:
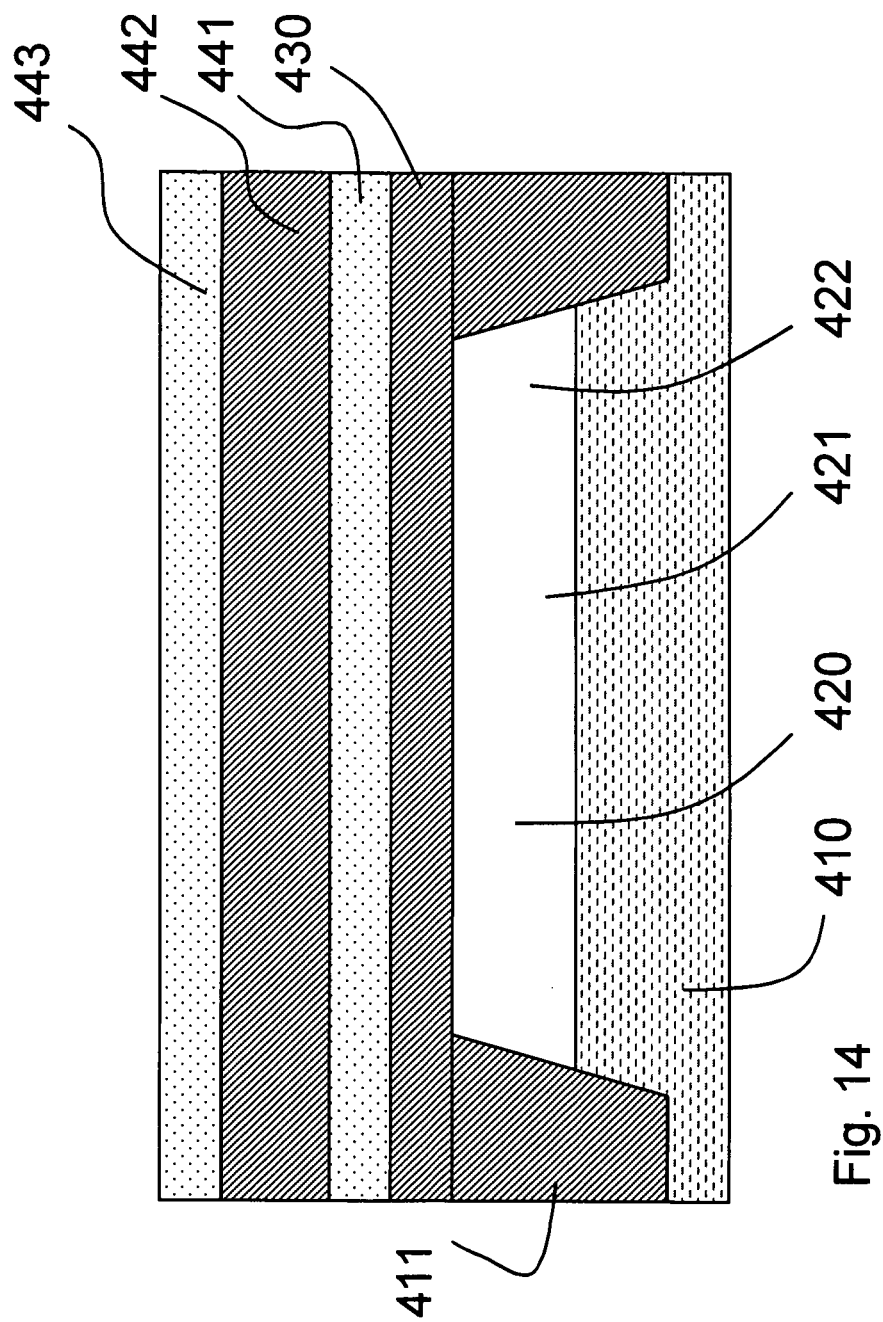
FIGS. 14-20 show cross-sections of the vertical bipolar transistor in FIG. 13 in different stages of an embodiment of a method for its production.

FIG. 14 shows a snapshot during production of the bipolar transistor. Field isolation regions 411 and the lower vertical portion 420 of the collector have already been made. A layer stack consisting of insulating layer 430, a first auxiliary layer 441, a second auxiliary layer 442 and a third auxiliary layer 443 has also been produced. Insulating layer 401 preferably consists of $SiO_2$ and is 20 nm to 150 nm, preferably 80 nm to 120 nm thick. The first auxiliary layer 441 preferably consists of $Si_3N_4$ and is 20 nm to 150 nm, preferably 50 nm to 120 nm thick. The second auxiliary layer 442 preferably consists of $SiO_2$ and is 50 nm to 250 nm, preferably 130 nm to 170 nm thick. The third auxiliary layer 443 preferably consists of $Si_3N_4$ and is 50 nm to 100 nm, preferably 60 nm to 80 nm thick.

Figure 15:
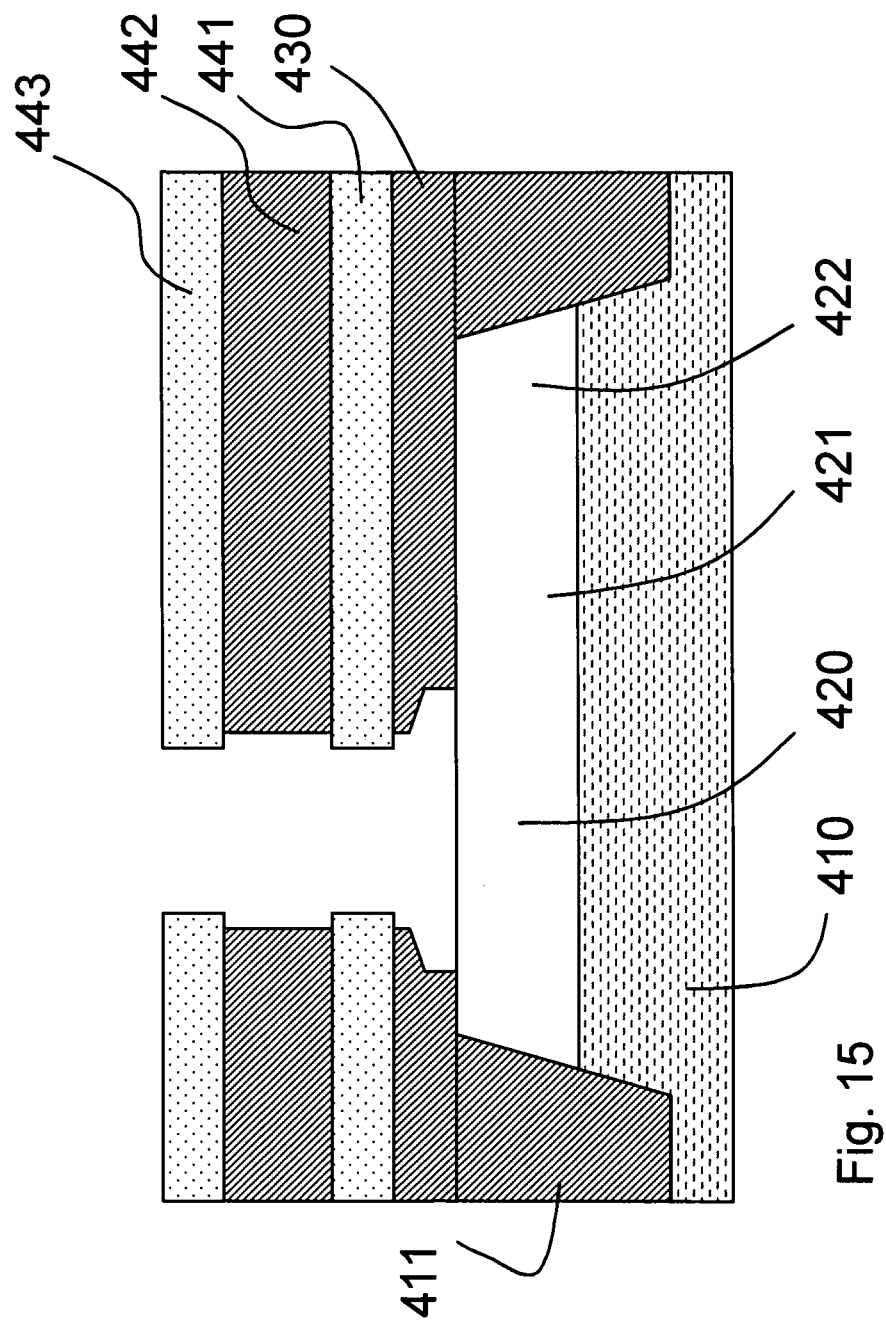

A window defined by a photolithographic process is now produced in layers 443, 442, 441 and 430; cf. FIG. 15. This is preferably done using standard anisotropic dry etch methods, except for removal of the lowermost regions of layer 430, which are removed as gently as possible with a wet chemical etching method from the monocrystalline region 420, the lower, first vertical portion of the collector. Analogously to Example 1, the profile may be adjusted thereby in such a way that the transistor window widens toward the substrate.

At this point, auxiliary layers 441 and 443 may optionally be drawn back with a further wet chemical etching process if they project significantly further into the transistor window than layers 430 and 442.

Figure 16:
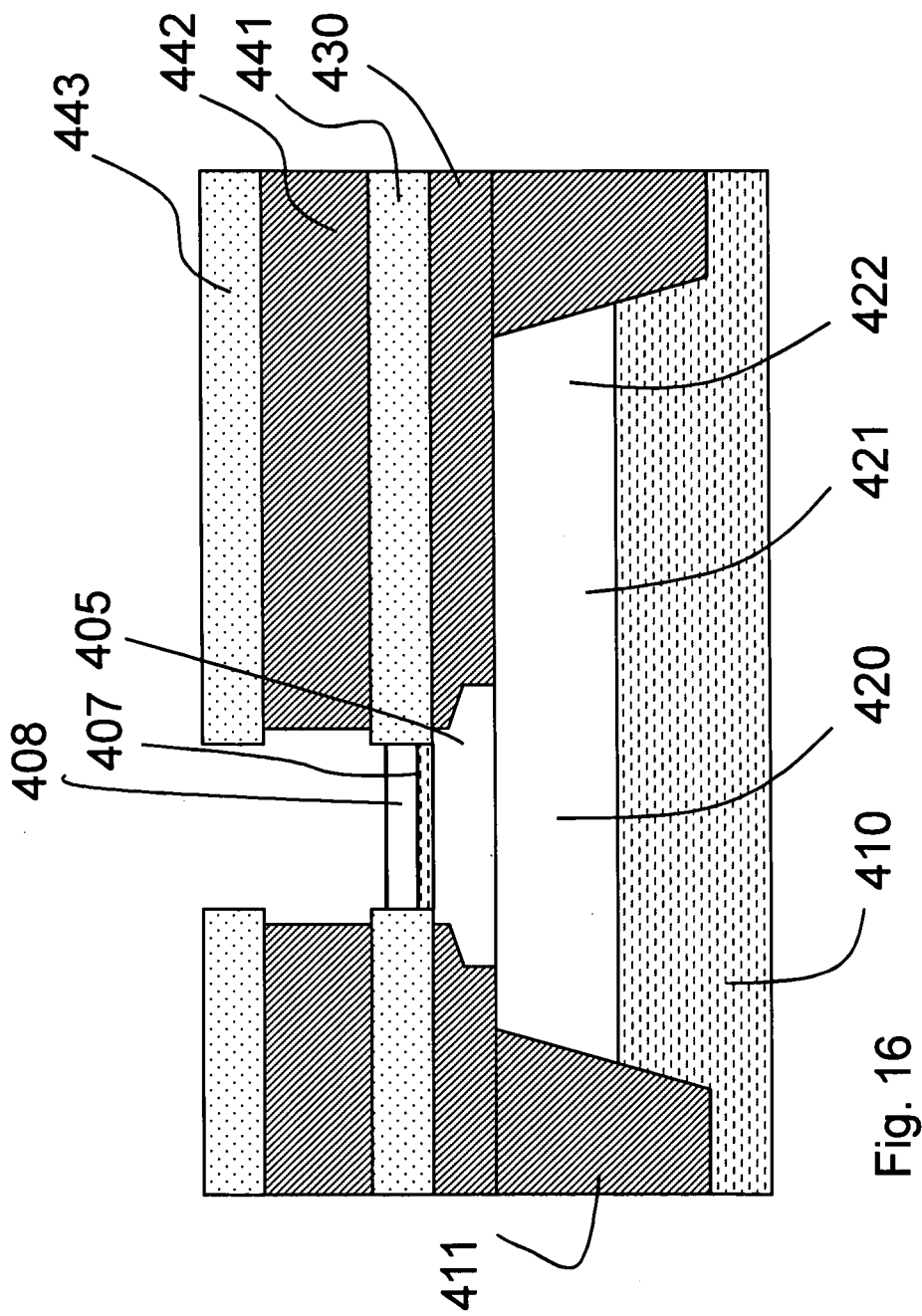

The monocrystalline semiconductor layer 405, base stack 407 and cap layer 408 are now produced by selective epitaxial growth in the region of the transistor window on the first vertical portion 420 of the collector; cf. FIG. 16. This growth can be interrupted in the meantime in order to implant SIC region 406. However, it is also possible to implant the region through the grown base stack at a later stage. In the present embodiment, SIC region 406 is not drawn in until later, in the stage shown in FIG. 18, but without excluding the variant of earlier implantation as described.

Figure 17:
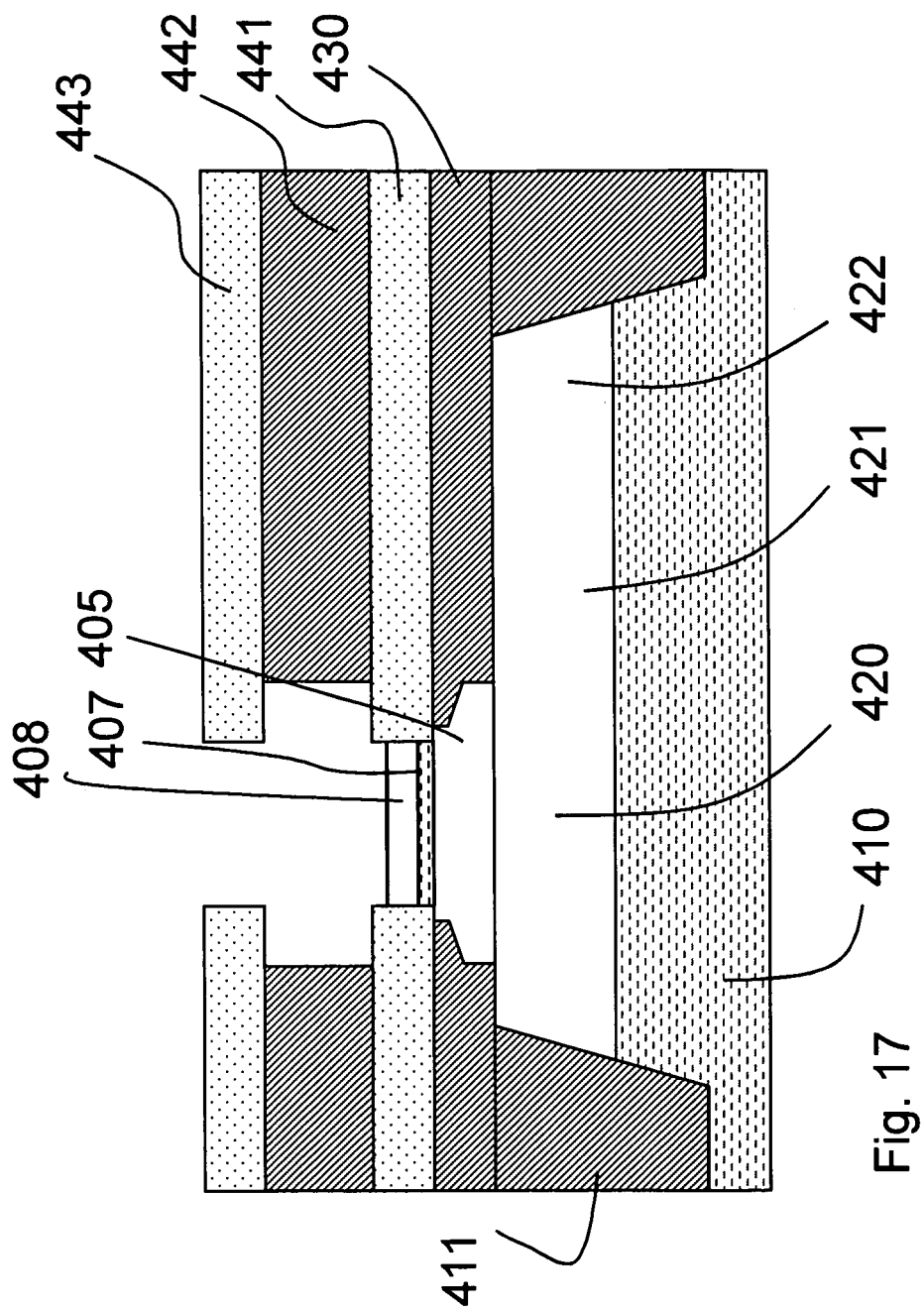
Figure 18:
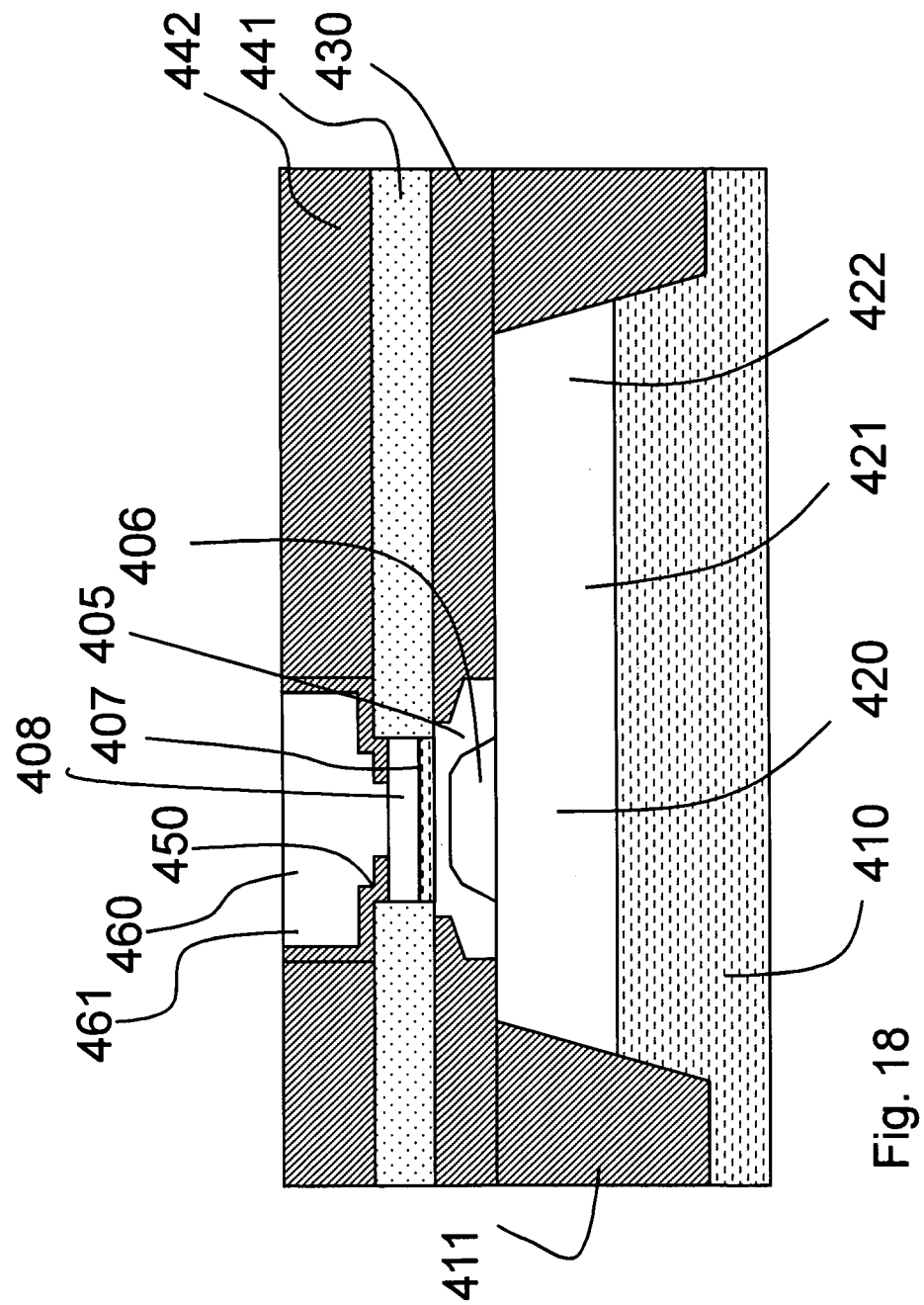

At this point, auxiliary layer 442 is drawn back laterally by a wet chemical etching process so that a recess is created between layers 441 and 443; cf. FIG. 17. The lateral extension of this recess, which can be adjusted for a given etchant by varying the duration of the etching process, determines the later lateral extension of the overlap between emitter contact 460 and base connection region 431. The lateral extension of this overlap is therefore self-alignigly positioned with respect to the transistor window and therefore to the other regions of the bipolar transistor produced in the transistor window.

L-shaped spacers 450 and emitter 460 are now produced analogously to Example 1, in that one space consisting of a $SiO_2$ and a $Si_3N_4$ layer is firstly produced at the inner wall of the transistor window, the $Si_3N_4$ is removed and emitter 460 is produced as polycrystalline, monocrystalline or partly monocrystalline and partly polycrystalline, either by selective growth or by a combination of polycrystalline deposition or differential deposition with a CMP step. Auxiliary layer 443 is then removed. This moment in production is shown in FIG. 15.

The next step is the deposition of an auxiliary layer 444, preferably consisting of $SiO_2$ and 30 nm to 100 nm, preferably 40 nm to 60 nm thick. With the aid of a photolithographically structured photoresist mask, layers 444 and 442 are structured by standard dry etch methods in such a way that they defined the shape of the subsequent base connection region. Auxiliary layer 441 is now laterally removed from under layer 442, selectively with respect to all the other layers present, and preferably by wet chemical etching, until the side wall of base layer stack 407 is exposed. The state is shown in FIG. 19.

Base connection region 431 is now produced. This is preferably done by selective epitaxial growth. However, it can also be produced by depositing an amorphous layer which is made crystalline by thermal treatment. This production state is shown in FIG. 20.

Another variant for the design of the base connection region is shown in FIG. 21. After producing a first, monocrystalline region 431a of the base connection region, the distance between layers 430 and 442 may be increased by isotropic etching before a further region 431b is produced, which may be monocrystalline or polycrystalline.

If the base connection region was not produced exclusively by selective methods, the silicon which is produced outside the actual base connection region is removed in a next step by a dry etch process, which removes the silicon selectively with respect to $SiO_2$. During this etching, the base connection region thus remains protected by layer 442, which serves as a mask during the etching process.

In a subsequent etching process that removes $SiO_2$ selectively with respect to silicon, the $SiO_2$ layers covering the emitter, base and collector contact areas are removed. A cross-section as shown in FIG. 13 is obtained by said process.

The bipolar transistor is finally completed by producing a high level of n-doping in the region of collector contact 422, preferably by ion beam implantation, by production of a silicide to reduce parasitic resistances on the emitter, base and collector contact regions, and finally by producing contacts in the form of metal contacts that connect the bipolar transistor to a system of external conducting lines separated from it by an insulating layer.

Other variants of the method besides those described above are possible, of course. In one variant, for example, the structures are rotated relative to conventional deposition by 45 degrees about an axis perpendicular to the surface of the substrate, thus providing advantages in the selective growth of Si, which ultimately improves the high-speed characteristics of the bipolar transistor as well.

In addition to bipolar transistors, the semiconductor device may also contain other semiconductor components produced with MOS or CMOS technology. The above description of the Figures was limited to the example of NPN bipolar transistors. However, the invention is not limited to those. A bipolar transistor of a semiconductor device according to the invention may be executed either as an NPN or as a PNP transistor. When selecting the material for the inner transistor and the base connection region, a person skilled in the art can look up the material parameters for electron and hole mobilities of potential semiconductor materials, which are published in standard reference works.

What is claimed is:

1. A semiconductor device, comprising a substrate layer made of a semiconductor material of a first conductivity type and having a first insulation region, and a plurality of vertical bipolar transistors, each of the vertical bipolar transistors comprising a first vertical portion of a collector made of monocrystalline semiconductor material of a second conductivity type and disposed in an opening of the first insulation region, a second insulation region lying partly on the first vertical portion of the collector and partly on the first insulation region and having an opening in the region of the collector, in which opening a second vertical portion of the collector made of monocrystalline material is disposed, said portion including an inner region of the second conductivity type, a base made of monocrystalline semiconductor material of the first conductivity type, a base connection region surrounding the base in the lateral direction and being either partly or entirely monocrystalline, a T-shaped emitter made of semiconductor material of the second conductivity type and overlapping the base connection region, wherein a horizontal T-bar of the T-shaped emitter outwardly overlaps the respective base connection region, and wherein the lateral extension of said overlap has a maximum variation of 10 nanometers over the entire quantity of said vertical bipolar transistors of the semiconductor device.

2. The semiconductor device of claim 1, in which the material of the base connection region is silicon germanium with a germanium content of more than 35%.

3. The semiconductor device of claim 1, in which the material of the base connection region is germanium, whereas the material of the collector, base and emitter is silicon or silicon germanium.

4. The semiconductor device of claim 1, in which the base connection region contains a first polycrystalline semiconductor region of the first conductivity type and is connected to the base via a second polycrystalline semiconductor region of the first conductivity type.

5. The semiconductor device of claim 1, in which the base connection region contains two subregions, of which a first subregion immediately adjacent the base is monocrystalline.

6. The semiconductor device of claim 5, in which a second subregion of the base connection region has a greater vertical thickness than the first subregion.

7. The semiconductor device of claim 1, in which a buffer layer made of monocrystalline semiconductor material is disposed between the collector and the base.

8. The semiconductor device of claim 1, in which a cap layer made of monocrystalline semiconductor material is disposed between the base and the emitter.

9. The semiconductor device of claim 1, wherein the base connection region consists of a semiconductor material which differs in its chemical composition from the semiconductor material of the collector, the base and the emitter and in which the majority charge carriers of the first conductivity type have greater mobility compared thereto.

* * * * *